US012484228B2

(12) United States Patent
Young et al.

(10) Patent No.: US 12,484,228 B2
(45) Date of Patent: Nov. 25, 2025

(54) SEMICONDUCTOR CHIP

(71) Applicant: Taiwan Semiconductor Manufacturing Company, Ltd., Hsinchu (TW)

(72) Inventors: Bo-Feng Young, Taipei (TW); Sheng-Chen Wang, Hsinchu (TW); Sai-Hooi Yeong, Hsinchu County (TW); Yu-Ming Lin, Hsinchu (TW); Chao-I Wu, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 432 days.

(21) Appl. No.: 17/178,257

(22) Filed: Feb. 18, 2021

(65) Prior Publication Data

US 2021/0408049 A1    Dec. 30, 2021

Related U.S. Application Data

(60) Provisional application No. 63/045,196, filed on Jun. 29, 2020.

(51) Int. Cl.
| | |
|---|---|
| *H10B 53/40* | (2023.01) |
| *H10B 51/20* | (2023.01) |
| *H10B 51/40* | (2023.01) |
| *H10B 53/20* | (2023.01) |
| *H10B 61/00* | (2023.01) |
| *H10N 50/85* | (2023.01) |

(52) U.S. Cl.
CPC ............. *H10B 51/20* (2023.02); *H10B 51/40* (2023.02); *H10B 53/20* (2023.02); *H10B 53/40* (2023.02); *H10B 61/22* (2023.02); *H10N 50/85* (2023.02)

(58) Field of Classification Search
CPC ......... H01L 27/11509; H01L 27/11514; H01L 27/1159; H01L 27/11592; H01L 27/11597; H01L 27/228; H01L 29/6684; H01L 43/10; H10B 51/20; H10B 51/30; H10B 51/40; H10B 53/20; H10B 53/40; H10B 61/22; H10N 50/85; H10D 30/0415
See application file for complete search history.

(56) References Cited

U.S. PATENT DOCUMENTS

| | | | |
|---|---|---|---|
| 2003/0138977 A1* | 7/2003 | Cerva | H01L 21/02271 257/E21.664 |
| 2016/0027827 A1* | 1/2016 | Sekine | H04N 25/78 257/43 |
| 2019/0393224 A1* | 12/2019 | Wang | G11C 11/4074 |
| 2020/0357929 A1* | 11/2020 | Le | H01L 27/1225 |
| 2021/0035989 A1* | 2/2021 | Lee | H01L 29/775 |

* cited by examiner

*Primary Examiner* — Meiya Li
(74) *Attorney, Agent, or Firm* — JCIPRNET

(57) ABSTRACT

A semiconductor chip including a semiconductor substrate, an interconnect structure and memory devices is provided. The semiconductor substrate includes first transistors, and the first transistors are negative capacitance field effect transistors. The interconnect structure is disposed over the semiconductor substrate and electrically connected to the first transistors, and the interconnect structure includes stacked interlayer dielectric layers, interconnect wirings, and second transistors embedded in the stacked interlayer dielectric layers. The memory devices are embedded in the stacked interlayer dielectric layers and electrically connected to the second transistors.

20 Claims, 14 Drawing Sheets

SEMICONDUCTOR CHIP

CROSS-REFERENCE TO RELATED APPLICATION

This application claims the priority benefit of U.S. provisional application Ser. No. 63/045,196, filed on Jun. 29, 2020. The entirety of the above-mentioned patent application is hereby incorporated by reference herein and made a part of this specification.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for miniaturization, higher speed and greater bandwidth, as well as lower power consumption and latency has grown recently, there has grown a need for semiconductor chips having embedded memory cells.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
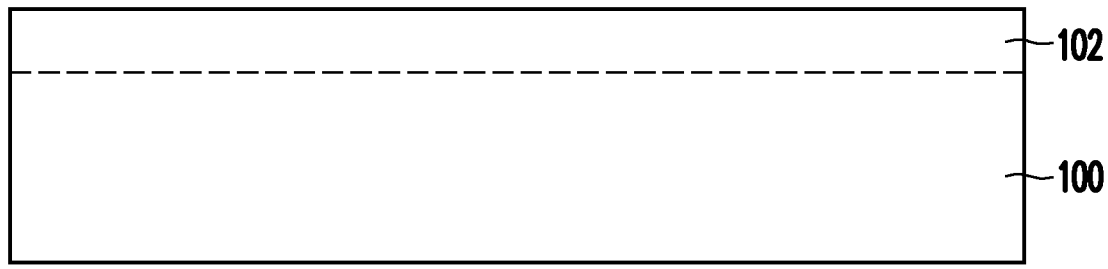
FIG. 1 through FIG. 16 are cross-sectional views schematically illustrating a process flow for fabricating a semiconductor chip in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g. a composition which is "substantially free" from Y may be completely free from Y.

Embodiments of the disclosure may relate to (fin-type field-effect transistor) FinFET structure having fins. The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. However, the fins may be formed using one or more other applicable processes.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIG. 1 through FIG. 16 are cross-sectional views schematically illustrating a process flow for fabricating a semiconductor chip in accordance with some embodiments of the present disclosure.

Referring to FIG. 1, a semiconductor substrate 100 is provided. In some embodiments, the semiconductor substrate 100 is a bulk semiconductor substrate, such as a semiconductor wafer. For example, the semiconductor substrate 100 includes silicon or other elementary semiconductor materials such as germanium. The semiconductor substrate 100 may be an un-doped or doped (e.g., p-type, n-type, or a combination thereof) semiconductor substrate. In some embodiments, the semiconductor substrate 100 includes an epitaxially grown semiconductor layer on a dielectric layer. The epitaxially grown semiconductor layer may be made of silicon germanium, silicon, germanium, one or more other suitable materials, or a combination thereof.

In some other embodiments, the semiconductor substrate 100 includes a compound semiconductor. For example, the compound semiconductor includes one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions. Each one of X1, X2, X3, Y1, Y2, Y3, and Y4 is greater than or equal to zero, and added together they equal 1. The compound semiconductor may include silicon carbide, gallium arsenide, indium arsenide, indium phosphide, one or more other suitable compound semiconductors, or a combination thereof. Other suitable substrate including II-VI compound semiconductors may also be used.

In some embodiments, the semiconductor substrate 100 is an active layer of a semiconductor-on-insulator (SOI) substrate. The SOI substrate may be fabricated using a separation by implantation of oxygen (SIMOX) process, a wafer bonding process, another applicable method, or a combination thereof. In some other embodiments, the semiconductor substrate 100 includes a multi-layered structure. For example, the semiconductor substrate 100 includes a silicon-germanium layer formed on a bulk silicon layer.

Multiple fin structures 102 are formed on the semiconductor substrate 100, in accordance with some embodiments. For illustration, only one fin structure 102 is shown in FIG. 1. In some embodiments, multiple recesses (or trenches) are formed in the semiconductor substrate 100. As a result, multiple fin structures 102 that protrude from the surface of the semiconductor substrate 100 are formed or defined between the recesses (or trenches). In some embodiments, one or more photolithography and etching processes are used to form the recesses (or trenches). In some embodiments, the fin structures 102 are in direct contact with the semiconductor substrate 100.

However, embodiments of the disclosure have many variations and/or modifications. In some other embodiments, the fin structures 102 are not in direct contact with the semiconductor substrate 100. One or more other material layers (not shown in FIG. 1) may be formed between the semiconductor substrate 100 and the fin structures 102. For example, a dielectric layer is formed between the semiconductor substrate 100 and the fin structures 102.

Afterwards, isolation features (not shown in FIG. 1) are formed in the recesses to surround a lower portion of the fin structures 102, in accordance with some embodiments. The isolation features are used to define and electrically isolate various device elements formed in and/or over the semiconductor substrate 100. In some embodiments, the isolation features include shallow trench isolation (STI) features, local oxidation of silicon (LOCOS) features, another suitable isolation feature, or a combination thereof.

In some embodiments, each of the isolation features has a multi-layer structure. In some embodiments, the isolation features are made of a dielectric material. The dielectric material may include silicon oxide, silicon nitride, silicon oxynitride, fluoride-doped silicate glass (FSG), low-K dielectric material, another suitable material, or a combination thereof. In some embodiments, an STI liner (not shown) is formed to reduce crystalline defects at the interface between the semiconductor substrate 100 and the isolation features. Similarly, the STI liner may also be used to reduce crystalline defects at the interface between the fin structures and the isolation features.

In some embodiments, a dielectric material layer is deposited over the semiconductor substrate 100. The dielectric material layer covers the fin structures 102 and fills the recesses between the fin structures. In some embodiments, the dielectric material layer is deposited using a flowable chemical vapor deposition (FCVD) process, an atomic layer deposition (ALD) process, a spin coating process, one or more other applicable processes, or a combination thereof.

In some embodiments, a planarization process is performed to thin down the dielectric material layer and to expose a mask layer or a stop layer covering top surfaces of the fin structures 102. The planarization process may include a chemical mechanical polishing (CMP) process, a grinding process, an etching process, a dry polishing process, one or more other applicable processes, or a combination thereof. Afterwards, the dielectric material layer is etched back to below the top of the fin structures 102. As a result, the remaining portions of the dielectric material layer form the isolation features. The fin structures 102 protrude from the top surface of the isolation features.

Figure 2:
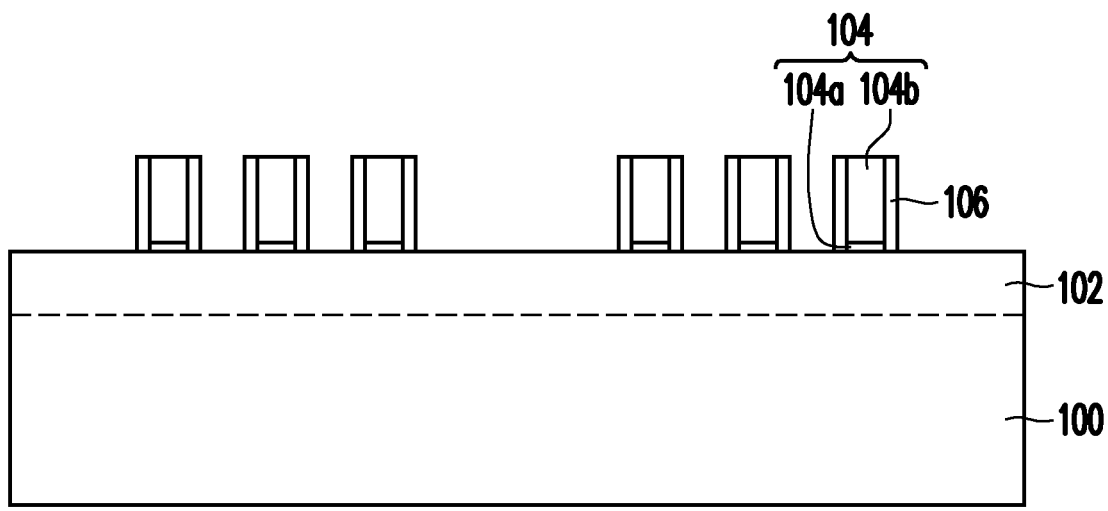

Referring to FIG. 2, dummy gate stacks 104 are formed over the semiconductor substrate 100, in accordance with some embodiments. The dummy gate stacks 104 partially cover and wrap around the fin structures 102, respectively. As shown in FIG. 2, the dummy gate stacks 104 may be substantially identical in width. In some alternative embodiments, the dummy gate stacks 104 may be different in width.

In some embodiments, each of the dummy gate stacks 104 has a dummy gate dielectric layer 104a and a dummy gate electrode 104b. The dummy gate dielectric layer 104a may be made of or include silicon oxide, silicon oxynitride, silicon nitride, one or more other suitable materials, or a combination thereof. The dummy gate electrode 104b may be made of or include a semiconductor material, such as polysilicon. In some embodiments, a dielectric material layer and a gate electrode material layer are sequentially deposited over the semiconductor substrate 100 and the fin structures 102. The dielectric material layer may be deposited using a CVD process, an ALD process, a thermal oxidation process, a physical vapor deposition (PVD) process, one or more other applicable processes, or a combination thereof. Afterwards, one or more photolithography processes and one or more etching processes may be used to partially remove the dielectric material layer and the gate electrode material layer. As a result, the remaining portions 104a and 104b of the dielectric material layer and the gate electrode material layer form the dummy gate stacks 104.

Afterwards, spacer elements 106 are formed over sidewalls of the dummy gate stacks 104, as shown in FIG. 2 in accordance with some embodiments. The spacer elements 106 may be used to protect the dummy gate stacks 104 and assist in subsequent processes for forming source/drain features and/or metal gates. In some embodiments, the spacer elements 106 are made of or include a dielectric material. The dielectric material may include silicon nitride, silicon oxynitride, silicon oxide, silicon carbide, one or more other suitable materials, or a combination thereof.

In some embodiments, a dielectric material layer is deposited over the semiconductor substrate 100, the fin structures 102, and the dummy gate stacks 104. The dielectric material layer may be deposited using a CVD process, an ALD process, a spin coating process, one or more other applicable processes, or a combination thereof. Afterwards, the dielectric material layer is partially removed using an etching process, such as an anisotropic etching process. As a result, the remaining portions of the dielectric material layer over the sidewalls of the dummy gate stacks 104 form the spacer elements 106.

Figure 3:
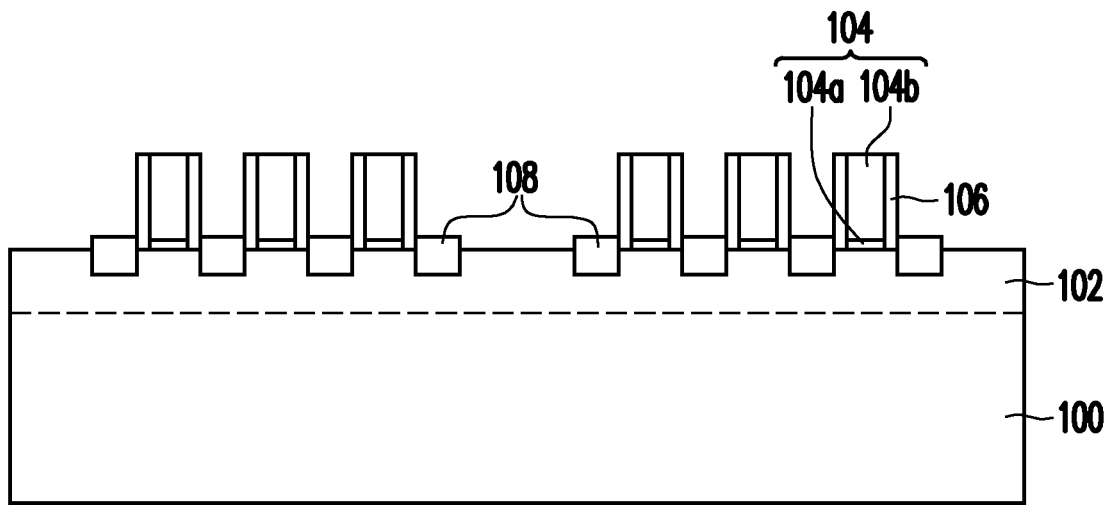

Referring to FIG. 3, epitaxial structures 108 are respectively formed over the fin structures 102, in accordance with some embodiments. The epitaxial structures 108 may function as source/drain features. In some embodiments, the portions of the fin structures 102 that are not covered by the dummy gate stacks 104 and the spacer elements 106 are recessed before the formation of the epitaxial structures 108. In some embodiments, the recesses laterally extend towards the channel regions under the dummy gate stacks 104. For example, portions of the recesses are directly below the spacer elements 106. Afterwards, one or more semiconductor materials are epitaxially grown on sidewalls and bottoms of the recesses to form the epitaxial structures 108. In some embodiments, both the epitaxial structures 108 are p-type semiconductor structures. In some other embodiments, both the epitaxial structures 108 are n-type semiconductor structures. In some other embodiments, one of the epitaxial structures 108 is a p-type semiconductor structure, and another one is an n-type semiconductor structure. A p-type semiconductor structure may include epitaxially grown silicon germanium or silicon germanium doped with boron. An n-type semiconductor structure may include epitaxially grown silicon, epitaxially grown silicon carbide (SiC), epitaxially grown silicon phosphide (SiP), or another suitable epitaxially grown semiconductor material. In some embodiments, the epitaxial structures 108 are formed by an epitaxial process. In some other embodiments, the epitaxial structures 108 are formed by separate processes, such as separate epitaxial growth processes. The epitaxial structures 108 may be formed by using a selective epitaxial growth (SEG) process, a CVD process (e.g., a vapor-phase epitaxy (VPE) process, a low pressure chemical vapor deposition (LPCVD) process, and/or an ultra-high vacuum CVD (UHV-CVD) process), a molecular beam epitaxy process, one or more other applicable processes, or a combination thereof.

In some embodiments, one or both of the epitaxial structures 108 are doped with one or more suitable dopants. For example, the epitaxial structures 108 are SiGe source/drain features doped with boron (B), indium (In), or another suitable dopant. Alternatively, in some other embodiments, one or both of the epitaxial structures 108 are Si source/drain features doped with phosphor (P), antimony (Sb), or another suitable dopant.

In some embodiments, the epitaxial structures 108 are doped in-situ during their epitaxial growth. In some other embodiments, the epitaxial structures 108 are not doped during the growth of the epitaxial structures 108. Instead, after the formation of the epitaxial structures 108, the epitaxial structures 108 are doped in a subsequent process. In some embodiments, the doping is achieved by using an ion implantation process, a plasma immersion ion implantation process, a gas and/or solid source diffusion process, one or more other applicable processes, or a combination thereof. In some embodiments, one or more annealing processes are performed to activate the dopants in the epitaxial structures 108. For example, a rapid thermal annealing process is used.

Figure 4:
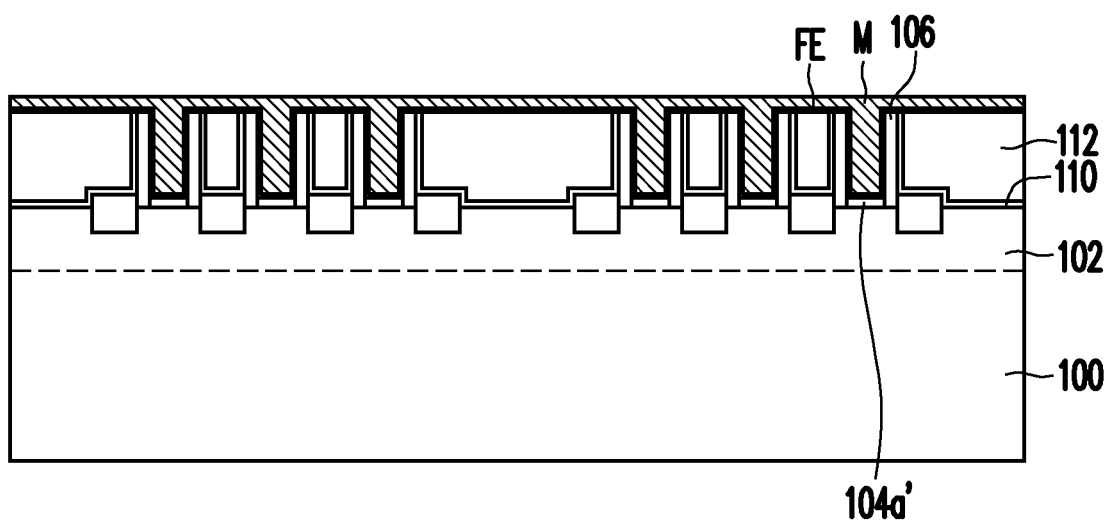

Referring to FIG. 3 and FIG. 4, an etch stop layer 110 and a dielectric layer 112 are sequentially deposited over the fin structures 102 of the semiconductor substrate 100, the dummy gate stacks 104 and the epitaxial structures 108, in accordance with some embodiments. The etch stop layer 110 may conformally extend along the surfaces of the fin structures 102, the dummy gate stacks 104, the spacer elements 106 and the epitaxial structures 108. The dielectric layer 112 covers the etch stop layer 110 and laterally surrounds the spacer elements 106 and the dummy gate stacks 104. The etch stop layer 110 may be made of or include silicon nitride, silicon oxynitride, silicon carbide, one or more other suitable materials, or a combination thereof. In some embodiments, the etch stop layer 110 is deposited over the semiconductor substrate 100, the dummy gate stacks 104 and the spacer elements 106 using a CVD process, an ALD process, a PVD process, one or more other applicable processes, or a combination thereof. The dielectric layer 112 may be made of or include silicon oxide, silicon oxynitride, borosilicate glass (BSG), phosphoric silicate glass (PSG), borophosphosilicate glass (BPSG), fluorinated silicate glass (FSG), low-k material, porous dielectric material, one or more other suitable materials, or a combination thereof. In some embodiments, the dielectric layer 112 is deposited over the etch stop layer 110 using a CVD process, an ALD process, a FCVD process, a PVD process, one or more other applicable processes, or a combination thereof.

Afterwards, a planarization process is performed to remove upper portions of the dielectric layer 112 and the etch stop layer 110. As a result, the top surfaces of the dielectric layer 112, the etch stop layer 110, the spacer elements 106, and the dummy gate stacks 104 are substantially level with each other, which benefits subsequent fabrication processes. The planarization process may include a CMP process, a grinding process, an etching process, a dry polishing process, one or more other applicable processes, or a combination thereof.

As shown in FIG. 3 and FIG. 4, the dummy gate electrodes 104b are removed and replaced by gate electrodes 104b' through a gate replacement process. During the above-mentioned gate replacement process, the gate dielectric layers 104a and the dummy gate electrodes 104b may be removed and replaced by gate dielectric layers 104a', ferroelectric layers 105 and gate electrodes 104b'. The gate dielectric layers 104a and the dummy gate electrodes 104b may be removed by at least one etching process. The gate dielectric layers 104a' are made of or includes a dielectric material with high dielectric constant (high-K). The gate dielectric layer 104a' may be made of or include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, one or more other suitable high-K materials, or a combination thereof. The gate dielectric layer 104a' may be deposited using an ALD process, a CVD process, one or more other applicable processes, or a combination thereof. In some embodiments, the formation of the gate dielectric layer 104a' involves a thermal operation.

In some alternative embodiments, not illustrated in figures, the gate replacement process merely includes replacing the dummy gate electrodes 104b with the gate electrodes 104b' and the ferroelectric layers 105, and the gate dielectric layers 104a are not removed and replaced by the gate dielectric layers 104a'. In other words, after performing the gate replacement process, each of the gate stacks 104' includes the gate electrode 104b', the ferroelectric layer 105 and the gate dielectric layer 104a.

In an embodiment where the gate dielectric layers 104a are replaced with the gate dielectric layers 104a', an interfacial layer (not shown) is formed on the exposed surfaces of the fin structures 102 after removing the gate dielectric layer 104a and before forming the gate dielectric layer 104a'. The interfacial layer may be used to improve adhesion between the gate dielectric layer 104a' and the fin structures 102. The interfacial layer may be made of or include a semiconductor oxide material such as silicon oxide or germanium oxide. The interfacial layer may be formed using a thermal oxidation process, an oxygen-containing plasma operation, one or more other applicable processes, or a combination thereof.

After the gate dielectric layers 104a are replaced with the gate dielectric layers 104a', a ferroelectric material FE and a metallic material M are sequentially deposited over the dielectric layer 112, the spacer elements 106 and the gate dielectric layer 104a' such that spaces between the spacer elements 106 are filled by the ferroelectric material FE and a metallic material M. The material of the ferroelectric layer FE may be or include $HfO_2$, $HfZrO_2$, AlScN, $HfO_2$ doped by at least one of Si, Ge, Y, La, Al. The metallic material M includes a work function layer and a conductive filling layer, in accordance with some embodiments.

Figure 5:
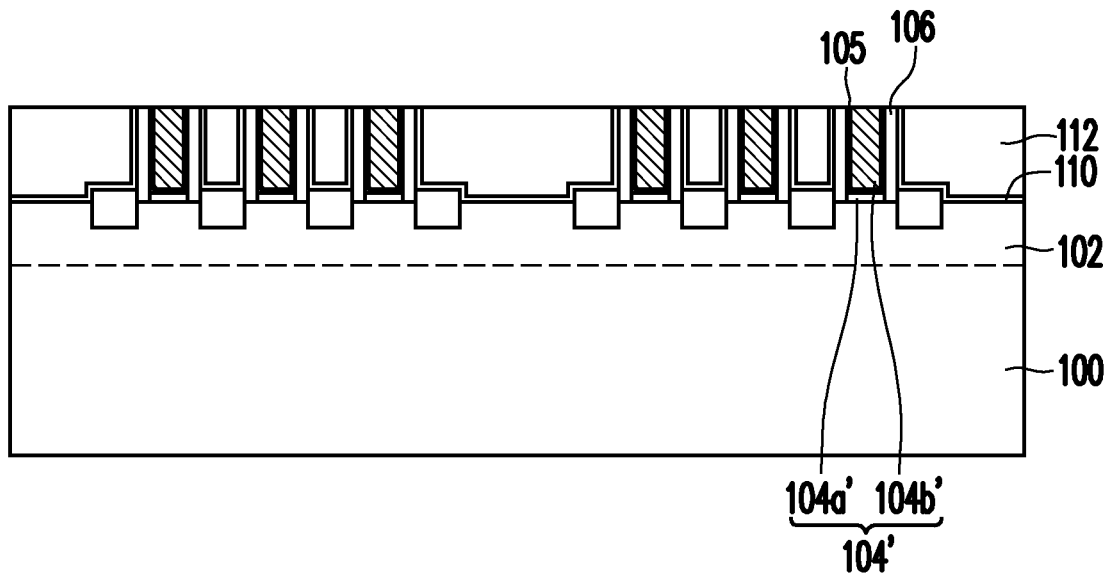

Referring to FIG. 4 and FIG. 5, a planarization process is performed to remove the deposited ferroelectric material FE and metallic material M until the top surfaces of the etch stop layer 110, the dielectric layer 112 and the spacer elements 106 are revealed. The planarization process may include a chemical mechanical polishing (CMP) process, a grinding process, an etching process, a dry polishing process, one or more other applicable processes, or a combination thereof. After performing the planarization process, ferroelectric layers 105 and the gate stacks 104' each including the gate dielectric layers 104a' and the gate electrodes 104b' are formed.

As illustrated in FIG. 5, the gate electrodes 104b' are spaced apart from the spacer elements 106 and the gate dielectric layer 104a' by the ferroelectric layers 105. The ferroelectric layers 105 may each includes a bottom portion and sidewall portions. The gate electrodes 104b' are spaced apart from the gate dielectric layer 104a' by the bottom portion of the ferroelectric layers 105, and gate electrodes 104b' are laterally spaced apart from the spacer elements 106 by the sidewall portions of the ferroelectric layers 105. In some alternative embodiments, not illustrated in figures, the ferroelectric layers 105 may merely vertically separate the gate electrodes 104b' and the gate dielectric layer 104a'. In other words, the gate electrodes 104b' are not spaced apart from the spacer elements 106 by the ferroelectric layers 105, and the gate electrodes 104b' may be in directly contact with the spacer elements 106.

The thickness of the ferroelectric layers 105 may be substantially equal to or less than that of the gate dielectric layer 104a'. The thickness ratio of the ferroelectric layers 105 and the gate dielectric layer 104a' may range from about 0.1 to about 1. The thickness of the ferroelectric layers 105 may be about 2 nanometers to about 20 nanometers. The ferroelectric layers 105 may be deposited using an ALD process, a CVD process, a PVD process, an electroplating process, an electroless plating process, one or more other applicable processes, or a combination thereof. In some embodiments, a thermal treatment (e.g., annealing process or other heating process) is performed to crystalize the ferroelectric layers 105.

The gate electrode 104b' may include a work function layer and a conductive filling layer, in accordance with some embodiments. The work function layer may be used to provide the desired work function for transistors to enhance device performance including improved threshold voltage. In some embodiments, the work function layer is used for forming an NMOS device. The work function layer is an n-type work function layer. The n-type work function layer is capable of providing a work function value suitable for the device, such as equal to or less than about 4.5 eV. The n-type work function layer may include metal, metal carbide, metal nitride, or a combination thereof. For example, the n-type work function layer includes titanium nitride, tantalum, tantalum nitride, one or more other suitable materials, or a combination thereof. In some other embodiments, the n-type work function layer is an aluminum-containing layer. The aluminum-containing layer may be made of or include TiAlC, TiAlO, TiAlN, one or more other suitable materials, or a combination thereof.

In some embodiments, the work function layer is used for forming a PMOS device. The work function layer is a p-type work function layer. The p-type work function layer is capable of providing a work function value that is suitable for the device, such as equal to or greater than about 4.8 eV. The p-type work function layer may include metal, metal carbide, metal nitride, other suitable materials, or a combination thereof. For example, the p-type metal includes tantalum nitride, tungsten nitride, titanium, titanium nitride, other suitable materials, or a combination thereof.

The work function layer may also be made of or include hafnium, zirconium, titanium, tantalum, aluminum, metal carbides (e.g., hafnium carbide, zirconium carbide, titanium carbide, aluminum carbide), aluminides, ruthenium, palladium, platinum, cobalt, nickel, conductive metal oxides, or a combination thereof. The thickness and/or the compositions of the work function layer may be fine-tuned to adjust the work function level. For example, a titanium nitride layer is used as a p-type work function layer or an n-type work function layer, depending on the thickness and/or the compositions of the titanium nitride layer.

The work function layer may be deposited over the ferroelectric layers 105 using an ALD process, a CVD process, a PVD process, an electroplating process, an electroless plating process, one or more other applicable processes, or a combination thereof.

The conductive filling layer may be made of or includes a metal material. The metal material may include tungsten, aluminum, copper, cobalt, one or more other suitable materials, or a combination thereof. The conductive filling layer may be deposited using a CVD process, an ALD process, a PVD process, an electroplating process, an electroless plating process, one or more other applicable processes, or a combination thereof. In some embodiments, a blocking layer is formed over the work function layer before the formation of the conductive filling layer. The blocking layer may be used to prevent the subsequently formed conductive filling layer from diffusing or penetrating into the work function layer. The blocking layer may be made of or include tantalum nitride, titanium nitride, one or more other suitable materials, or a combination thereof. The blocking layer may be deposited using an ALD process, a PVD process, an electroplating process, an electroless plating process, one or more other applicable processes, or a combination thereof.

After performing the gate replacement process, manufacturing processes of front end of line (FEOL) is accomplished. After performing the gate replacement process, FEOL transistors each including a fin structure 102, a gate stack 104', a ferroelectric layer 105, a pair of spacer elements 106, and a pair of epitaxial structures 108 are formed. The FEOL transistors may be negative capacitance field effect transistors (NCFETs). Since the NCFETs are implemented in front end of line (FEOL) logic devices, I/O devices, and peripheral devices formed on semiconductor wafers, operation current ($I_{on}$) of the FEOL transistors may be increased, and operation voltage as well as power consumption of the FEOL transistors may be reduced.

After performing the gate replacement process, contacts 114, a dielectric layer 116, contacts 118a, contacts 118b, and conductive wirings 120 are formed over the semiconductor substrate 100.

Figure 6:
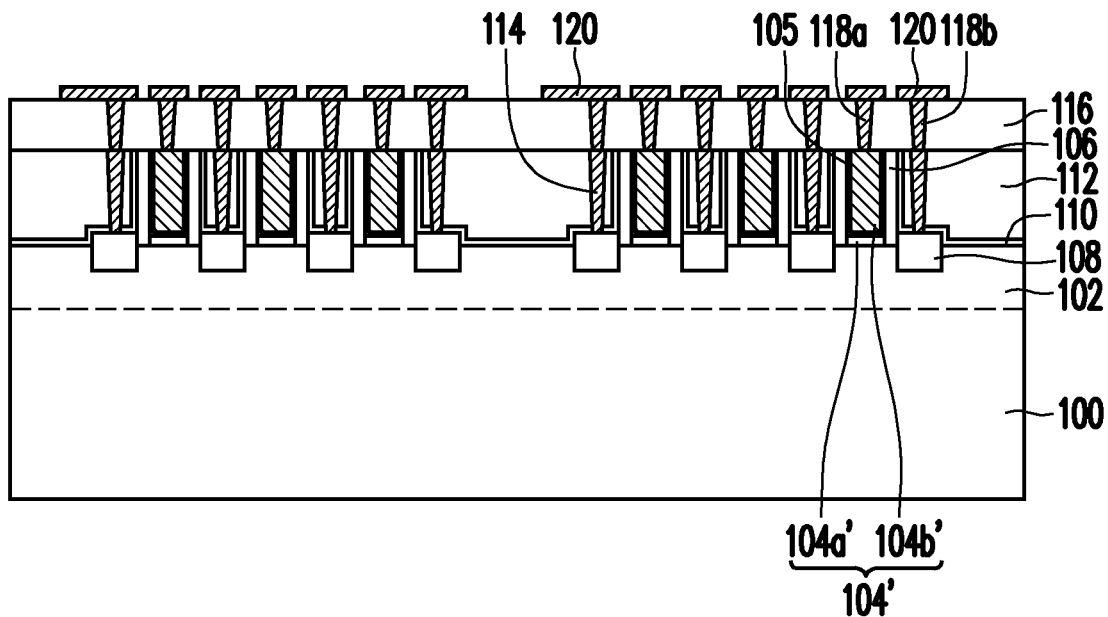

Referring to FIG. 5 and FIG. 6, the dielectric layer 112 and the etch stop layer 110 may be patterned by any suitable method. For example, the dielectric layer 112 and the etch stop layer 110 are patterned using photolithography process. After patterning the dielectric layer 112 and the etch stop layer 110, through holes are formed in the dielectric layer 112 and the etch stop layer 110 such that portions of the epitaxial structures 108 are exposed. A conductive material (e.g., copper or other suitable metallic materials) may be deposited over the dielectric layer 112 and fill into the through holes defined in the dielectric layer 112 and the etch stop layer 110. The conductive material may be deposited using a CVD process or other applicable processes. In some embodiments, a planarization process is performed to remove the deposited conductive material until the top surface of the dielectric layer 112 is revealed. The planarization process may include a chemical mechanical polishing (CMP) process, a grinding process, an etching process, a dry polishing process, one or more other applicable processes, or a combination thereof. As shown in FIG. 6, after performing the planarization process, the contacts 114 are formed to penetrated through the dielectric layer 112 and the etch stop layer 110, and the contacts 114 may serve as bottom portions of source/drain contacts which are electrically connected to the epitaxial structures 108 (i.e. the source/drain features 108).

The dielectric layer 116 may be deposited over the dielectric layer 112. In some embodiments, the dielectric layer 116 is deposited over the dielectric layer 112 using a CVD process, an ALD process, a FCVD process, a PVD process, one or more other applicable processes, or a combination thereof. The dielectric layer 116 may be made of or include silicon oxide, silicon oxynitride, BSG, PSG, BPSG, FSG, low-k material, porous dielectric material, one or more other suitable materials, or a combination thereof. The dielectric layer 116 may be patterned by any suitable method. For example, the dielectric layer 116 is patterned using photolithography process. After patterning the dielectric layer 116, through holes are formed in the dielectric layer 116 such that portions of the contacts 114 and portions of the gate electrode 104b' are exposed. A conductive material (e.g., copper or other suitable metallic materials) may be deposited over the dielectric layer 116 and fill into the through holes defined in the dielectric layer 116. The conductive material may be deposited using a CVD process or other applicable processes. In some embodiments, a planarization process is performed to remove the deposited conductive material until the top surface of the dielectric layer 116 is revealed. The planarization process may include a chemical mechanical polishing (CMP) process, a grinding process, an etching process, a dry polishing process, one or more other applicable processes, or a combination thereof. As shown in FIG. 6, after performing the planarization process, the contacts 118a and 118b are formed to penetrated through the dielectric layer 116, the contact 118a may serve as gate contacts which are electrically connected to the gate electrode 104b', and the contacts 118b land on the contacts 114 and may serve as upper portions of source/drain contacts.

The conductive wirings 120 may be formed on the dielectric layer 116 to electrically connected to the contacts 118a and 118b. A conductive material (e.g., copper or other suitable metallic materials) may be deposited on the top surfaces of the dielectric layer 116, and the conductive material may be patterned by any suitable method. For example, the conductive material is deposited using a CVD process or other applicable processes, and the conductive material is patterned using photolithography process.

After forming the conductive wirings 120, manufacturing processes of middle end of line (MEOL) are accomplished, and manufacturing processes of back end of line (BEOL) are performed.

Figure 7:
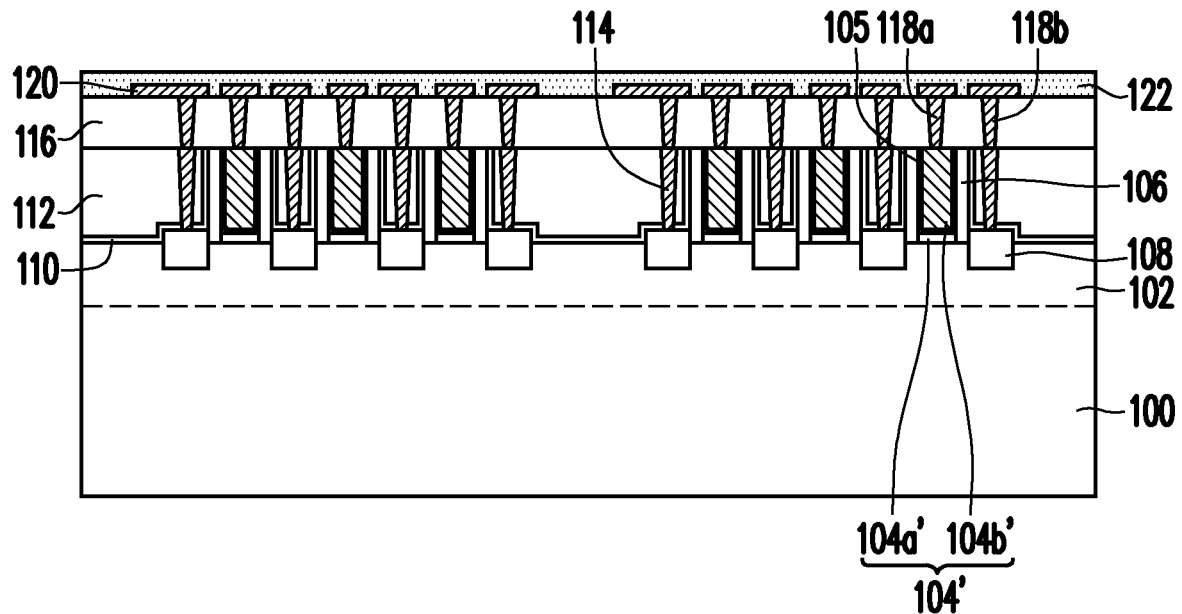

Referring to FIG. 7, a buffer layer 122 is formed over the dielectric layer 116 to cover the conductive wirings 120. The buffer layer 122 may be deposited over the dielectric layer 116 using a CVD process, an ALD process, a FCVD process, a PVD process, one or more other applicable processes, or a combination thereof. The buffer layer 122 may be made of or include silicon oxide, silicon oxynitride, BSG, PSG, BPSG, FSG, low-k material, porous dielectric material, one or more other suitable materials, or a combination thereof. The buffer layer 122 may be a planarization layer having a flat top surface and assist in subsequent processes for forming an interconnect structure including thin film transistors and memory devices embedded therein. In some embodiments, the buffer layer 122 may serve as a diffusion barrier layer for preventing contamination resulted from manufacturing processes of back end of line (BEOL).

Figure 8:
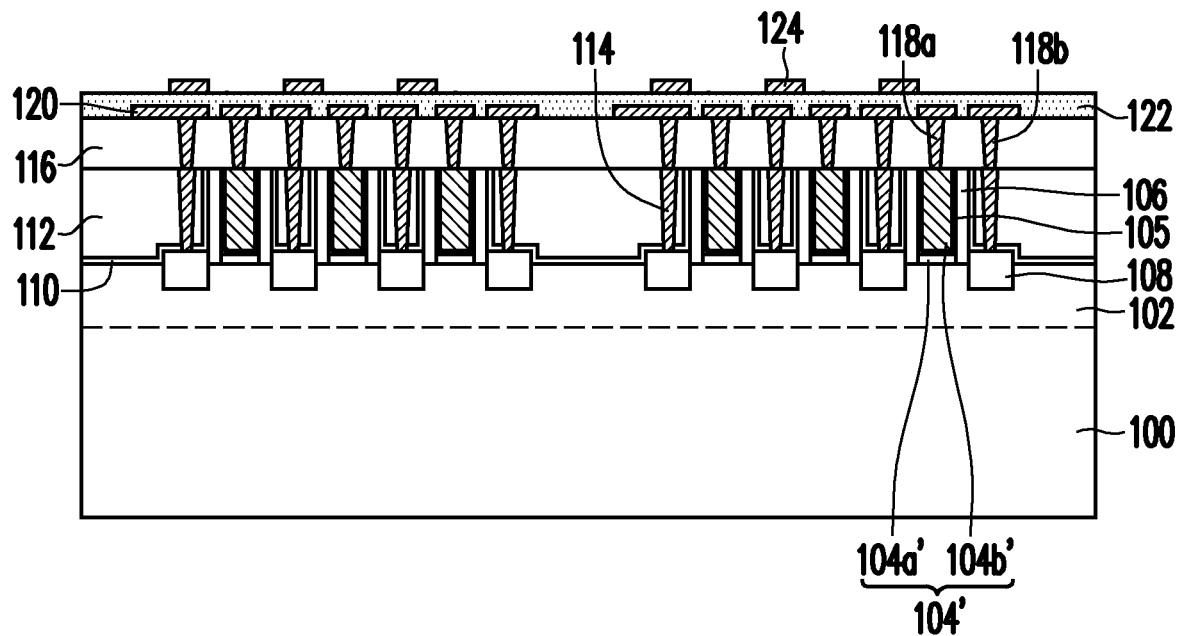

Referring to FIG. 8, gates 124 of driving transistors (e.g., thin film transistors) are formed on the buffer layer 122. A conductive material for forming the gates 124 may be deposited on the top surfaces of the buffer layer 122, and the conductive material for forming the gates 124 may be patterned by any suitable method. For example, the conductive material for forming the gates 124 is deposited using a CVD process or other applicable processes, and the conductive material is patterned using a photolithography process. The conductive material for forming the gates 124 may be or include molybdenum (Mo), gold (Au), titanium (Ti), or other applicable metallic materials, or a combination thereof. In some embodiments, the conductive material for forming the gates 124 includes a single metal layer. In some alternative embodiments, the conductive material for forming the gates 124 includes laminated metal layers.

Figure 9:
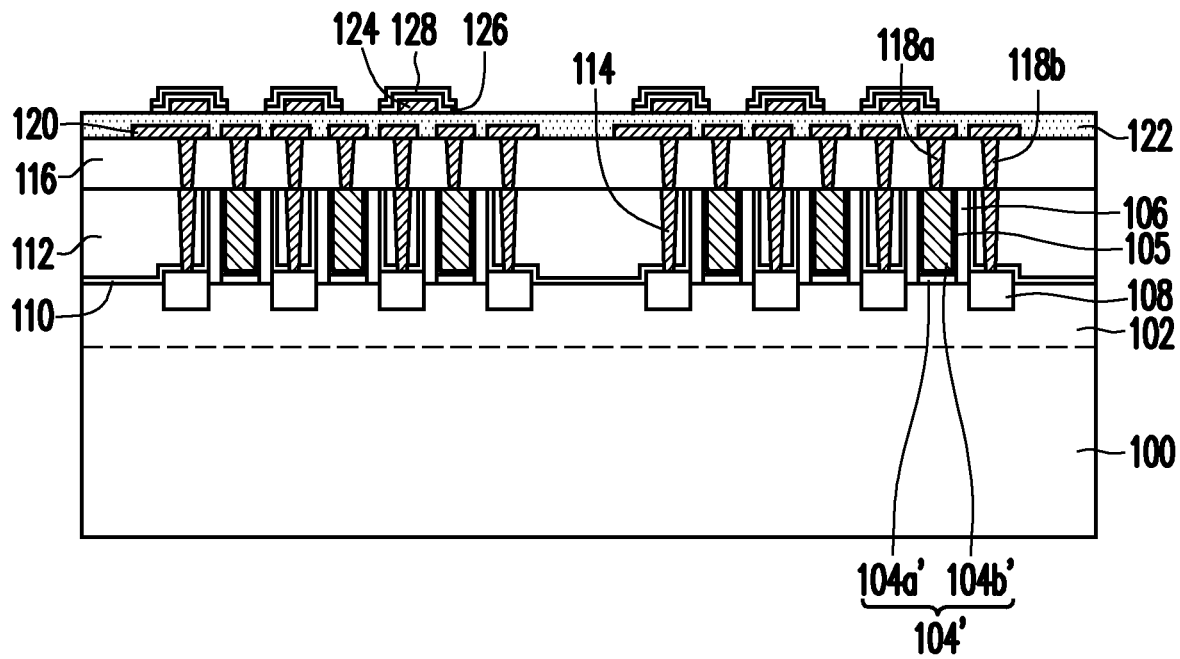

Referring to FIG. 9, gate insulating patterns 126 of driving transistors and semiconductor channel layers 128 of driving transistors are formed on the buffer layer 122 to cover the gates 124. The semiconductor channel layers 128 are electrically insulated from the gates 124 by the gate insulating patterns 126. In some embodiments, portions of the gates 124 are covered by the gate insulating patterns 126 and semiconductor channel layers 128. In some embodiments, the semiconductor channel layers 128 are oxide semiconductor patterns. The material of the gate insulating patterns 126 may be or include silicon dioxide ($SiO_2$), aluminum oxide ($Al_2O_3$), or other applicable insulating materials, or a combination thereof. The material of the semiconductor channel layers 128 may be or include amorphous indium gallium zinc oxide (IGZO), indium zinc oxide (IZO), indium gallium oxide, other applicable materials, or a combination thereof. In some embodiments, one or more insulating material layers and an oxide semiconductor material layer are formed on the top surfaces of the buffer layer 122 to cover the gates 124. The one or more insulating material layers and the oxide semiconductor material layer may be deposited using a CVD process or other applicable processes. The insulating material layer and the oxide semiconductor material layer may be patterned by any suitable method. For example, the insulating material layers and the oxide semiconductor material layer is simultaneously patterned using a photolithography process.

Figure 10:
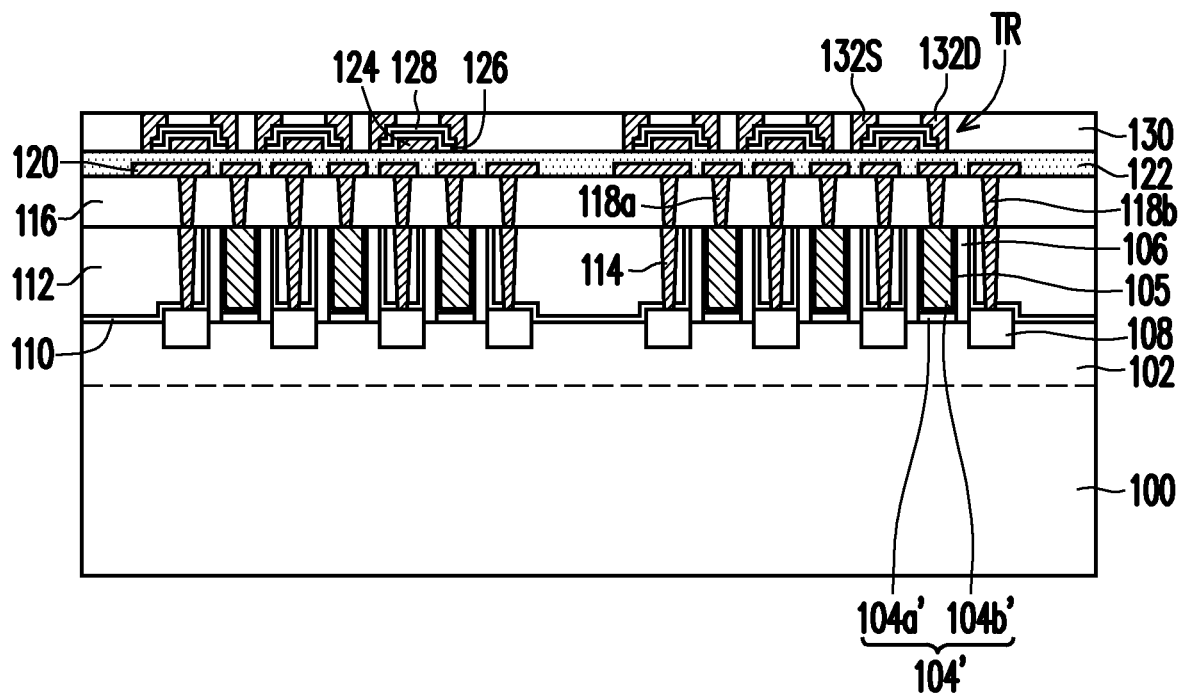

Referring to FIG. 10, an interlayer dielectric layer 130 is formed over the buffer layer 122 to cover the gate insulating patterns 126 and semiconductor channel layers 128. An interlayer dielectric material layer may be deposited over the buffer layer 122 using a CVD process, an ALD process, a FCVD process, a PVD process, one or more other applicable processes, or a combination thereof. The interlayer dielectric material layer may be made of or include silicon oxide, silicon oxynitride, BSG, PSG, BPSG, FSG, low-k material, porous dielectric material, one or more other suitable materials, or a combination thereof. The interlayer dielectric material layer may be patterned by any suitable method. For example, the interlayer dielectric material layer is patterned using a photolithography process such that the interlayer dielectric layer 130 including openings for exposing the gate insulating patterns 126 and semiconductor channel layers 128 is formed. After forming the interlayer dielectric layer 130, a conductive material (e.g., copper or other suitable metallic materials) may be deposited over the interlayer dielectric layer 130 to cover the top surface of the interlayer dielectric layer 130 and fill the openings defined in the interlayer dielectric layer 130. A removal process may be then performed to remove portions the conductive material until the top surface of the interlayer dielectric layer 130 is revealed such that source features 132S and drain features 132D of driving transistors TR are formed in the openings defined in the interlayer dielectric layer 130. The removal process may include a chemical mechanical polishing (CMP) process, a grinding process, an etching process, a dry polishing process, one or more other applicable processes, or a combination thereof.

The source features 132S and drain features 132D are embedded in the interlayer dielectric layer 130 and in contact with portions of the semiconductor channel layers 128. The source features 132S and drain features 132D are electrically insulated from the gates 124. The source features 132S and drain features 132D may have top surfaces leveled with the top surface of the interlayer dielectric layer 130. As shown in FIG. 10, the source features 132S and drain features 132D may be in contact with sidewalls of the gate insulating patterns 126 and the semiconductor channel layers 128. In some embodiments, the source features 132S and drain features 132D may cover and be in contact with portions of the buffer layer 122.

After forming the source features 132S and drain features 132D, fabrication of the driving transistors TR each including the gate 124, the gate insulating pattern 126, the semiconductor channel layer 128 and the source features 132S and drain features 132D are accomplished.

Figure 11:
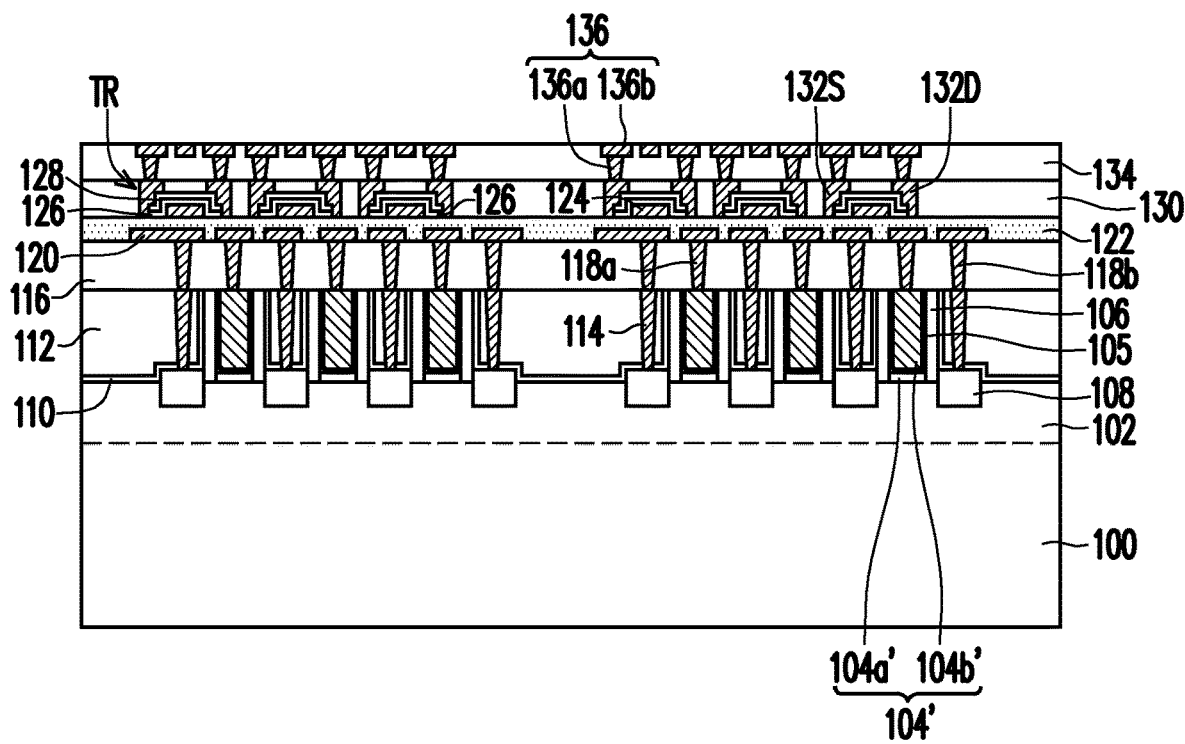

Referring to FIG. 11, an interlayer dielectric layer 134 is formed over the interlayer dielectric layer 130. An interlayer dielectric material layer may be deposited over the buffer layer 130 using a CVD process, an ALD process, a FCVD process, a PVD process, one or more other applicable processes, or a combination thereof. The interlayer dielectric material layer may be made of or include silicon oxide, silicon oxynitride, BSG, PSG, BPSG, FSG, low-k material, porous dielectric material, one or more other suitable materials, or a combination thereof. The interlayer dielectric material layer may be patterned by any suitable method. For example, the interlayer dielectric material layer is patterned using a photolithography process such that the interlayer dielectric layer 134 including damascene openings is formed. After forming the interlayer dielectric layer 134, a conductive material (e.g., copper or other suitable metallic materials) may be deposited over the interlayer dielectric layer 134 to cover the top surface of the interlayer dielectric layer 134 and fill the damascene openings defined in the interlayer dielectric layer 134. A removal process may be then performed to remove portions the conductive material until the top surface of the interlayer dielectric layer 134 is revealed such that interconnect wirings 136 are formed in the damascene openings defined in the interlayer dielectric layer 134. The removal process may include a chemical mechanical polishing (CMP) process, a grinding process, an etching process, a dry polishing process, one or more other applicable processes, or a combination thereof. In some embodiments, portions of the interconnect wirings 136 may serve as bit lines which are electrically connected to the source features 132S of the transistors TR.

As shown in FIG. 11, the interconnect wirings 136 may include via portions 136a and wiring portions 136b. The via portions 136a are disposed on and electrically connected to the source features 132S and drain features 132D. The wiring portions 136b are disposed on and electrically connected to the via portions 136a. The via portions 136a of the interconnect wirings 136 may transmit electrical signal vertically, and the wiring portions 136b of the interconnect wirings 136 may transmit electrical signal horizontally.

Figure 12:
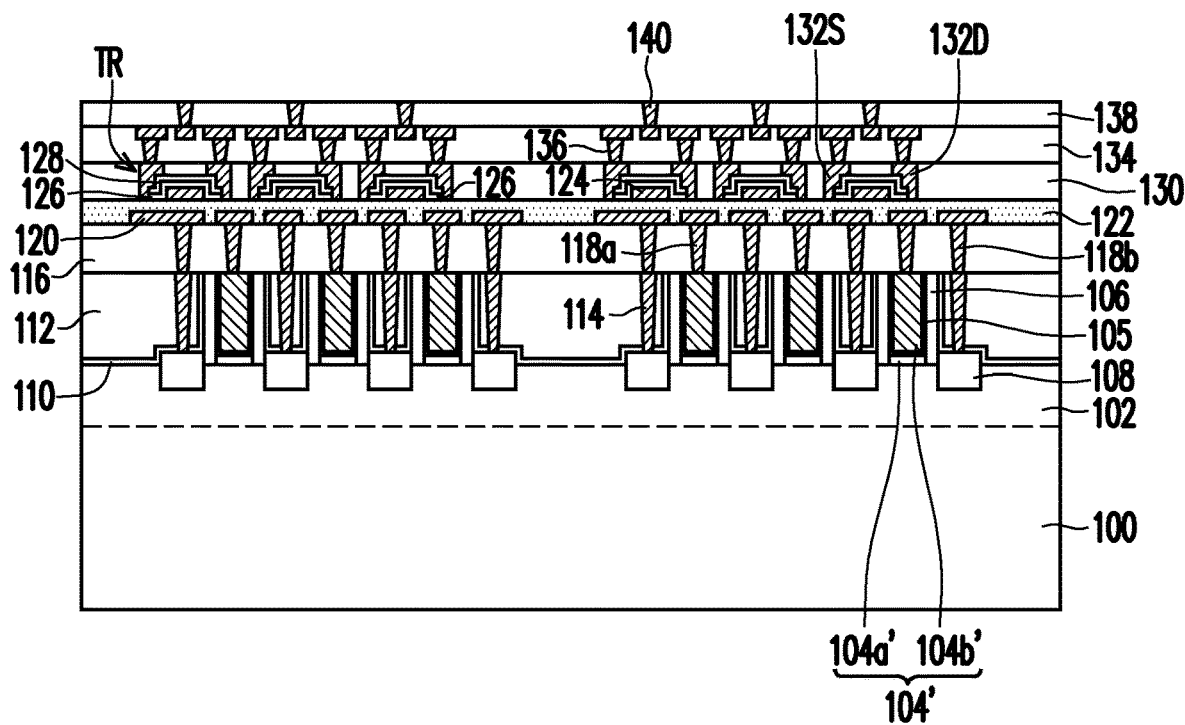

Referring to FIG. 12, an interlayer dielectric layer 138 is formed over the interlayer dielectric layer 134. An interlayer dielectric material layer may be deposited over the buffer layer 134 using a CVD process, an ALD process, a FCVD process, a PVD process, one or more other applicable processes, or a combination thereof. The interlayer dielectric material layer may be made of or include silicon oxide, silicon oxynitride, BSG, PSG, BPSG, FSG, low-k material, porous dielectric material, one or more other suitable materials, or a combination thereof. The interlayer dielectric material layer may be patterned by any suitable method. For example, the interlayer dielectric material layer is patterned using a photolithography process such that the interlayer dielectric layer 138 including via openings is formed. After forming the interlayer dielectric layer 138, a conductive material (e.g., copper or other suitable metallic materials) may be deposited over the interlayer dielectric layer 138 to cover the top surface of the interlayer dielectric layer 138 and fill the via openings defined in the interlayer dielectric layer 138. A removal process may be then performed to remove portions the conductive material until the top surface of the interlayer dielectric layer 138 is revealed such that conductive vias 140 are formed in the via openings defined in the interlayer dielectric layer 138. The removal process may include a chemical mechanical polishing (CMP) process, a grinding process, an etching process, a dry polishing process, one or more other applicable processes, or a combination thereof.

Figure 13:
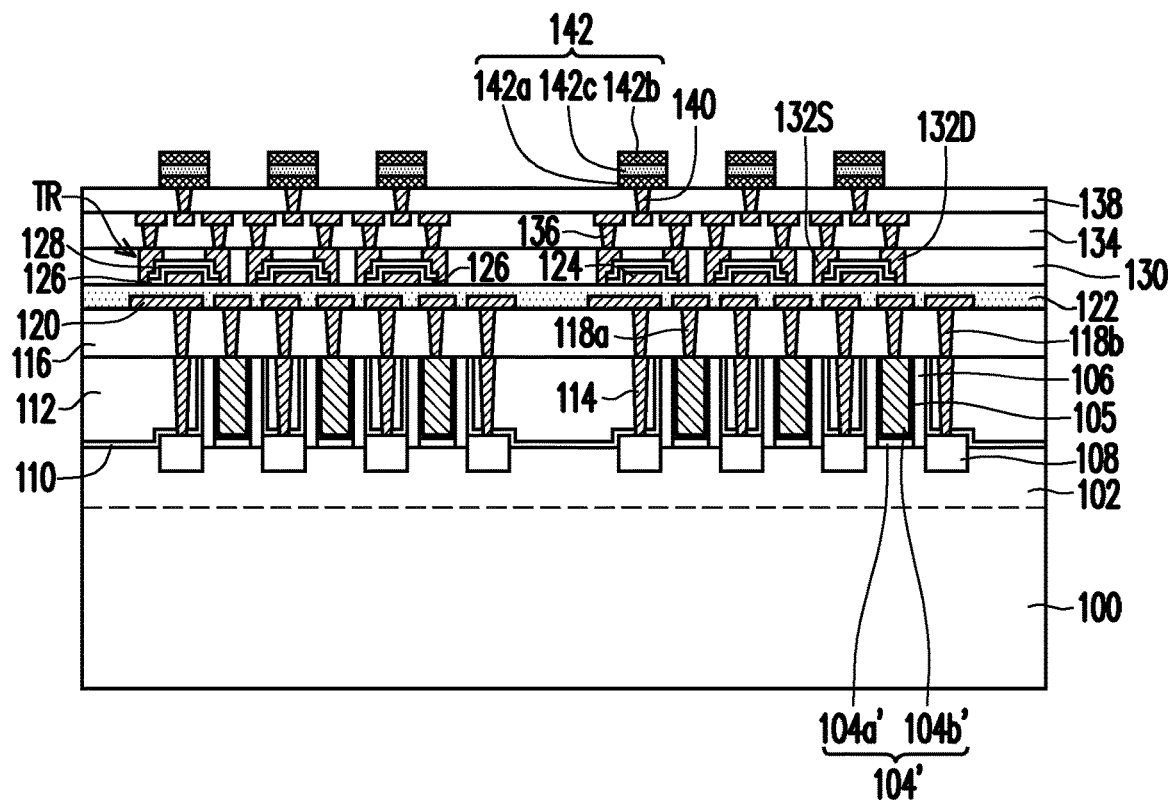

Referring to FIG. 13, memory devices 142 are formed over the interlayer dielectric layer 138. The memory devices 142 may include MTJ (magnetic tunneling junction) memory devices or FTJ (ferroelectric tunneling junction) memory devices. The memory devices 142 may each include a first electrode 142a (i.e. a bottom electrode), a second electrode 142b (i.e. a top electrode) and a storage layer 142c between the first electrode 142a and the second electrode 142b, wherein the first electrodes 142a of the memory devices 142 are electrically connected to the gates 124 of driving transistors TR through interconnect wirings (e.g., the conductive vias 140 embedded in the interlayer dielectric layer 138 and the interconnect wirings 136 embedded in the interlayer dielectric layer 134). The second electrodes 142b of the memory devices 142 may be electrically connected to word lines (not shown), and the word lines may be formed by interconnect wirings. For example, the word lines, the conductive vias 140 and the interconnect wirings 136 are formed simultaneously. The above-mentioned word lines, bit lines and driving transistors TR may constitute a driving circuit for the memory devices 142. In some embodiments, the memory devices 142 are ferroelectric random-access memory (FeRAM) devices, wherein the first electrodes 142a and the second electrodes 142b of the memory devices 142 are metallic electrodes (e.g., W, Ti, TiN, TaN, Ru, Cu, Co, Ni, one or more other applicable processes, or a combination thereof), and the storage layers 142c of the memory devices 142 are ferroelectric material layers (e.g., $HfO_2$, $HfZrO_2$, AlScN, $HfO_2$ doped by Si, Ge, Y, La, and Al). In some embodiments, the memory devices 142 are ferroelectric capacitors electrically connected to the gates 124 of the driving transistors TR, and the gates 124 of driving transistors TR are capacitively coupled to word lines through ferroelectric capacitors (i.e. memory devices 142 including the first electrode 142a, the second electrode 142b and the storage layer 142c). In some other embodiments, the memory devices 142 are ferroelectric capacitors electrically connected to the drain features 132D of the driving transistors TR. Since the ferroelectric memory devices 142 are fabricated through manufacturing processes of back end of line (BEOL), it is easy to obtain large area for layout of the ferroelectric capacitors.

In some other embodiments, the storage layers 142c of the memory devices 142 are the magnetic stacking including an insulating tunnel barrier and magnetic layers (e.g., free layer and reference layer) separated by an insulating tunnel barrier. The material of the free layer may be or include FeB, CoFeB or Ta, the material of the reference layer may be or include FeB, Ru or Co/Pt, and the material of the insulating tunnel barrier may be or include aluminum oxide ($AlO_x$), MgO, or NA.

A first conductive material layer, a ferroelectric material layer and a second conductive material layer may be sequentially deposited over the interlayer dielectric layer 138. The first conductive material layer, the ferroelectric material layer and the second conductive material layer may be deposited over the interlayer dielectric layer 138 using a CVD process, an ALD process, a FCVD process, a PVD process, one or more other applicable processes, or a combination thereof. The material of the first conductive material layer may be or include W, Ti, TiN, TaN, Ru, Cu, Co, Ni, one or more other applicable processes, or a combination thereof. The material of the ferroelectric material layer may be or include $HfO_2$, $HfZrO_2$, AlScN, $HfO_2$ doped by at least one of Si, Ge, Y, La, and Al. The material of the second conductive material layer may be or include W, Ti, TiN, TaN, Ru, Cu, Co, Ni, one or more other applicable processes, or a combination thereof. In some embodiments, the first conductive material and the second conductive material are the same. In some alternative embodiments, the first conductive material is different from the second conductive material. The first conductive material layer, the ferroelectric material layer and the second conductive material layer may be patterned by any suitable method. For example, the first conductive material layer, the ferroelectric material layer and the second conductive material layer is patterned using a photolithography process such that the memory devices 142 are formed over the interlayer dielectric layer 138.

Since the memory devices 142 are formed over the interlayer dielectric layer 138 through manufacturing processes of back end of line (BEOL), an overall area occupied by the memory devices 142 may range from about 400 $nm^2$ to about 25 $\mu m^2$, and the thickness of the memory devices 142 may range from about 5 nm to about 30 nm. The adjustment of capacitance of the memory devices 142 is flexible because the memory devices 142 are formed through manufacturing processes of back end of line (BEOL) and the interlayer dielectric layer 138 provides sufficient layout area for the memory devices 142. Accordingly, it is easy to form the memory devices 142 with high density.

Figure 14:
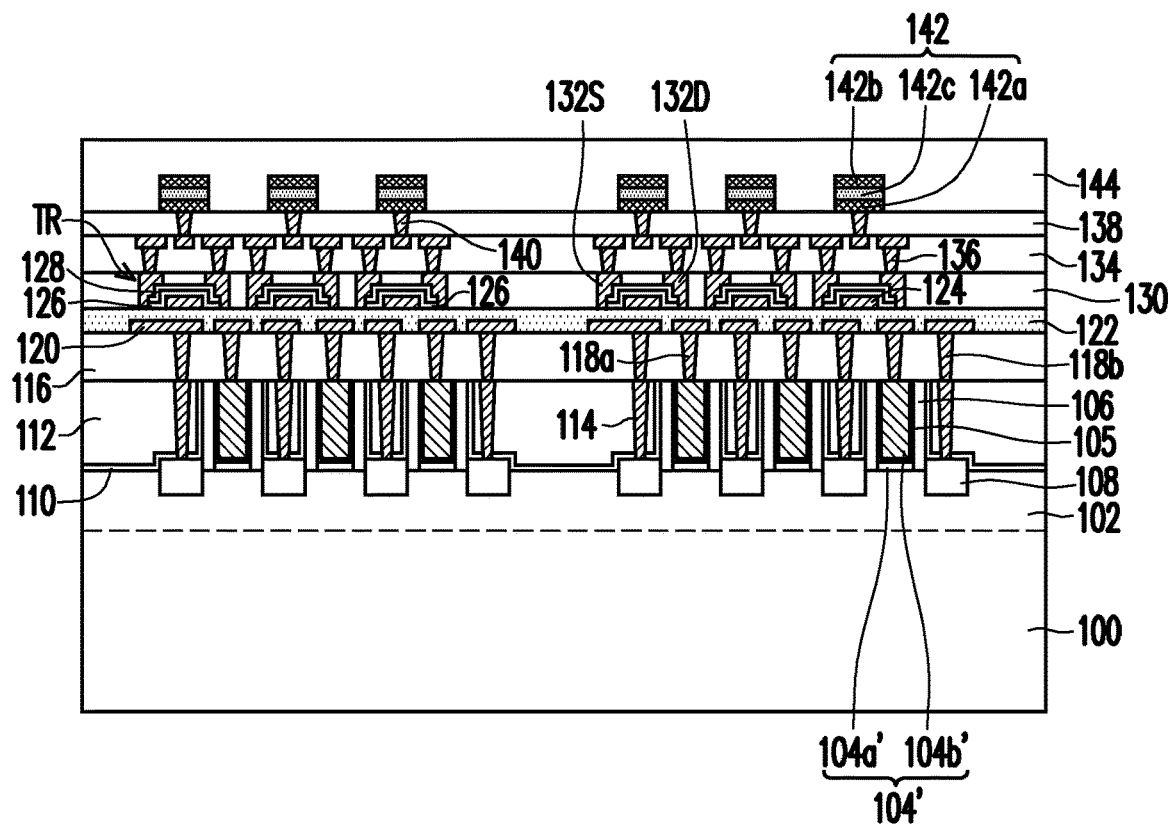
Figure 15:
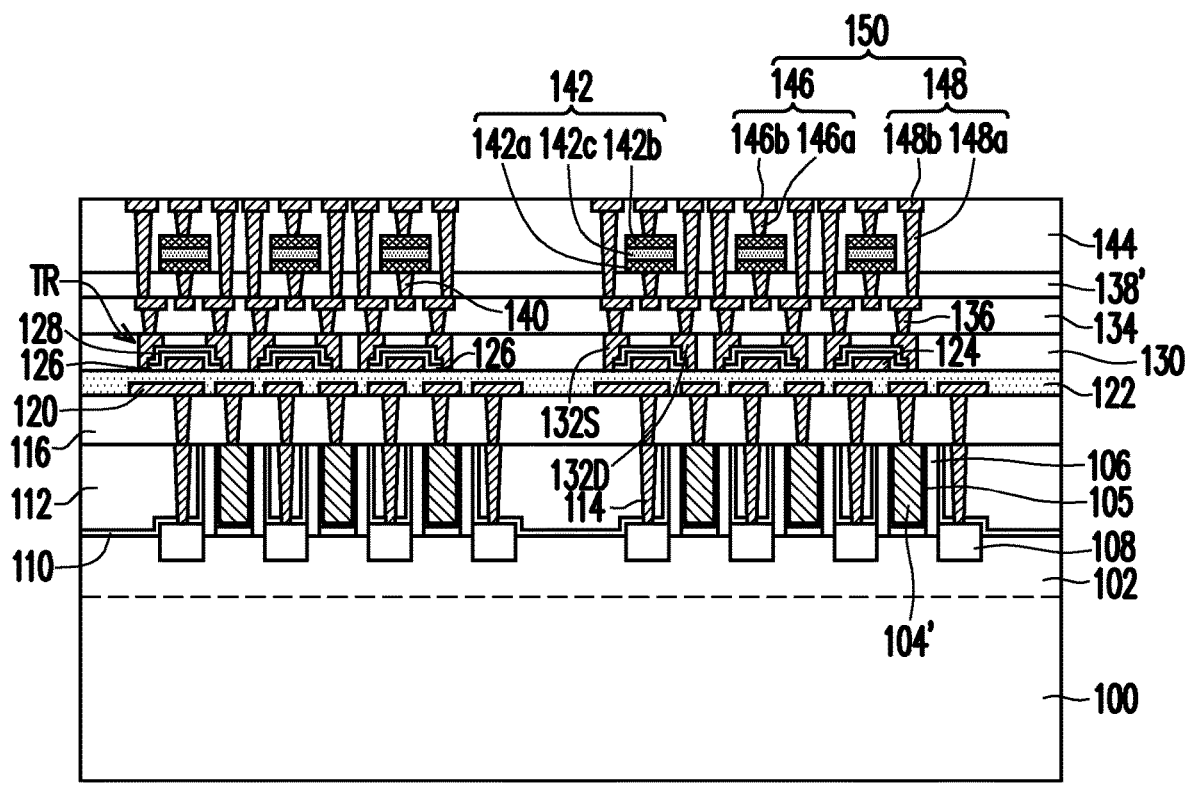

Referring to FIG. 14 and FIG. 15, an interlayer dielectric layer 144 is formed over the interlayer dielectric layer 138. An interlayer dielectric material layer may be deposited over the buffer layer 138 using a CVD process, an ALD process, a FCVD process, a PVD process, one or more other applicable processes, or a combination thereof. The interlayer dielectric material layer may be made of or include silicon oxide, silicon oxynitride, BSG, PSG, BPSG, FSG, low-k material, porous dielectric material, one or more other suitable materials, or a combination thereof. The interlayer dielectric material layer and may be patterned by any suitable method. For example, the interlayer dielectric material layer is patterned using a photolithography process. During the patterning process of the interlayer dielectric layer, the interlayer dielectric layer 138 may be further patterned such that the interlayer dielectric layer 144 and an interlayer dielectric layer 138' are formed, wherein damascene openings with higher aspect ratio are formed in the interlayer dielectric layer 144 and the interlayer dielectric layer 138' to expose the interconnect wirings 136, and damascene openings with lower aspect ratio are formed in the interlayer dielectric layer 144 to expose the second electrodes 142b of the memory devices 142. After forming the interlayer dielectric layer 144 and the interlayer dielectric layer 138', a conductive material (e.g., copper or other suitable metallic materials) may be deposited over the interlayer dielectric layer 144 to cover the top surface of the interlayer dielectric layer 144 and fill the damascene openings with different aspect ratios. A removal process may be then performed to remove portions the conductive material until the top surface of the interlayer dielectric layer 144 is revealed such that interconnect wirings 150 with different aspect ratios are formed in the damascene openings. The removal process may include a chemical mechanical polishing (CMP) process, a grinding process, an etching process, a dry polishing process, one or more other applicable processes, or a combination thereof.

In some embodiments, first interconnect wirings 146 among the interconnect wirings 150 penetrate through the interlayer dielectric layer 144 and the interlayer dielectric layer 138' to electrically connect to the interconnect wirings 136, and second interconnect wirings among the interconnect wirings 150 penetrate through the interlayer dielectric layer 144 to electrically connect to the second electrodes 142b of the memory devices 142. The interconnect wirings 146 may each include a via portions 146a and wiring portions 146b. The via portions 146a are disposed on and electrically connected to the second electrodes 142b of the memory devices 142. The wiring portions 146b are disposed on and electrically connected to the via portions 146a. The via portions 146a of the interconnect wirings 146 may transmit electrical signal vertically, and the wiring portions 146b of the interconnect wirings 146 may transmit electrical signal horizontally. The interconnect wirings 148 may each include a via portions 148a and wiring portions 148b. The via portions 148a are disposed on and electrically connected to the interconnect wirings 136. The wiring portions 148b are disposed on and electrically connected to the via portions 148a. The via portions 148a of the interconnect wirings 148 may transmit electrical signal vertically, and the wiring portions 148b of the interconnect wirings 148 may transmit electrical signal horizontally.

After forming the interconnect wirings 150, fabrication of a memory cell array including driving transistors TR embedded in the interlayer dielectric layer 130 and memory devices 142 embedded in the interlayer dielectric layers 138' and 144 is accomplished.

Figure 16:
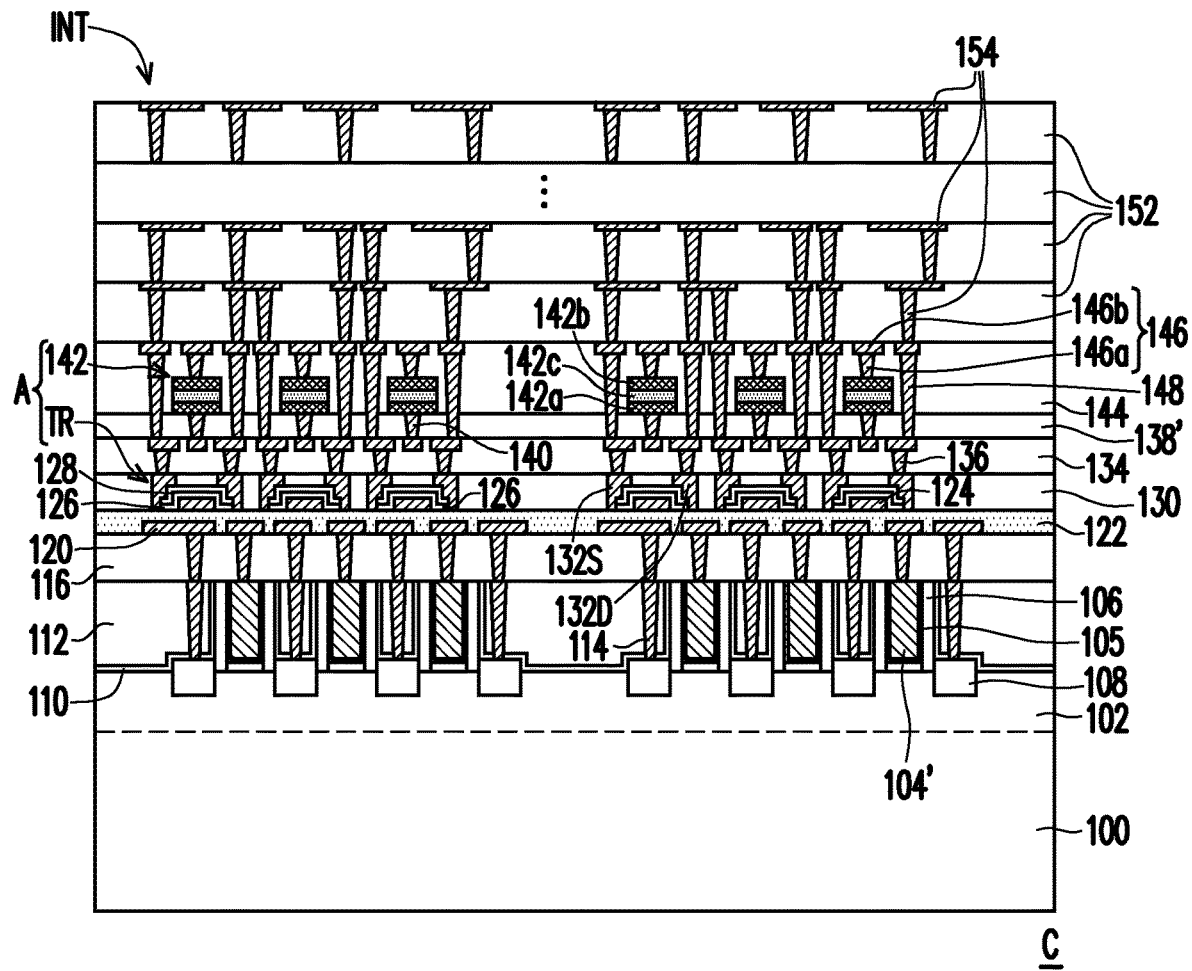

Referring to FIG. 16, interlayer dielectric layers 152 and interconnect wirings 154 are formed over the interlayer dielectric layer 144. The interconnect wirings 154 are embedded in the interlayer dielectric layers 152 and electrically connected to the memory devices 142 and/or the driving transistors TR through interconnect wirings 136, 146, and/or 148. The fabrication of the interlayer dielectric layers 152 and interconnect wirings 154 may be similar to that of the interlayer dielectric layers 134 and interconnect wirings 136. Detailed descriptions relate to the fabrication of the interlayer dielectric layers 152 and interconnect wirings 154 are thus omitted.

As illustrated in FIG. 16, a semiconductor chip C including a semiconductor substrate 100, an interconnect structure INT and a memory cell array A is provided. The semiconductor substrate 100 may include a logic circuit formed therein, and the logic circuit may include the transistors (e.g., FinFET, MOSFET or other applicable transistors) formed in and on the semiconductor substrate 100. The interconnect structure INT is disposed on the semiconductor substrate 100 and electrically connected to the logic circuit, and the interconnect structure INT includes stacked interlayer dielectric layers 130, 134, 138', 144 and 152, and interconnect wirings 136, 146, 148 and 154 embedded in the stacked interlayer dielectric layers 130, 134, 138', 144 and 152. The memory cell array A is embedded in the interlayer dielectric layers 130, 134 and 144. The memory cell array A includes driving transistors TR and memory devices M, and the memory devices M are electrically connected the driving transistors TR through the interconnect wirings 136, 140, 146 and/or 148. In some embodiments, the driving transistors TR include thin film transistors (e.g., bottom gate thin film transistors, top gate thin film transistors, double gate thin film transistors, or other applicable thin film transistors) disposed on the buffer layer 122. The driving transistors TR may include thin film transistors having respective gate insulating patterns 126.

In some embodiments, the memory cell array A includes word lines, bit lines, the driving transistors TR and the memory devices M, the memory devices M are electrically connected the word lines, and source features 132S of the driving transistors TR are electrically connected to the bit lines. In some embodiments, the driving transistors TR are embedded in a first interlayer dielectric layer 130, and the memory devices M of the memory cell array A are embedded in a second interlayer dielectric layer which includes layers 138' and 144. The second interlayer dielectric includes a first dielectric sub-layer 138' and a second dielectric sub-layer 144 covering the first dielectric sub-layer 138', the interconnect wirings include first vias 140 and second vias 146a, the first vias 140 are embedded in the first dielectric sub-layer 138' and electrically connected to the first electrodes 142a of the memory devices 142, the memory devices M and the second vias 146a are embedded in the second dielectric sub-layer 144, and the second vias 146a are electrically connected to the second electrodes 142b of the memory devices 142.

FIG. 17 through FIG. 21 are cross-sectionals view schematically illustrating various semiconductor chips in accordance with various embodiments of the present disclosure.

Figure 17:
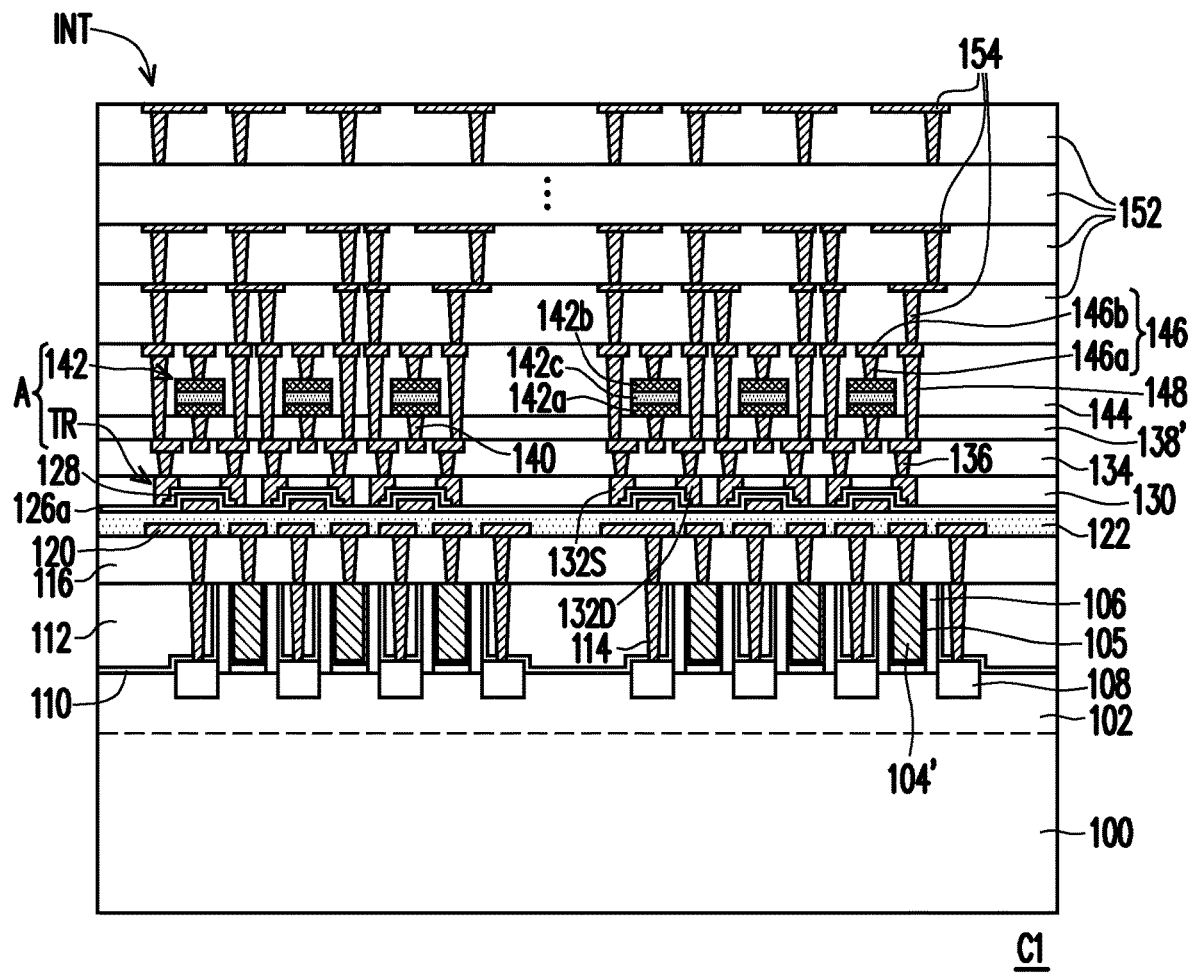
FIG. 17 through FIG. 21 are cross-sectionals view schematically illustrating various semiconductor chips in accordance with various embodiments of the present disclosure.

Referring to FIG. 16 and FIG. 17, the semiconductor chip C1 illustrated in FIG. 17 is similar to the semiconductor chip C illustrated in FIG. 16 except that the driving transistors TR include thin film transistors sharing a gate insulating layer 126a. The material of the gate insulating layer 126a may be or include silicon dioxide ($SiO_2$), aluminum oxide ($Al_2O_3$), or other applicable insulating materials, or a combination thereof. The gate insulating layer 126a is not patterned such that the gate insulating layer 126a entirely covers the buffer layer 122 and the gates 124 of the driving transistors TR.

Figure 18:
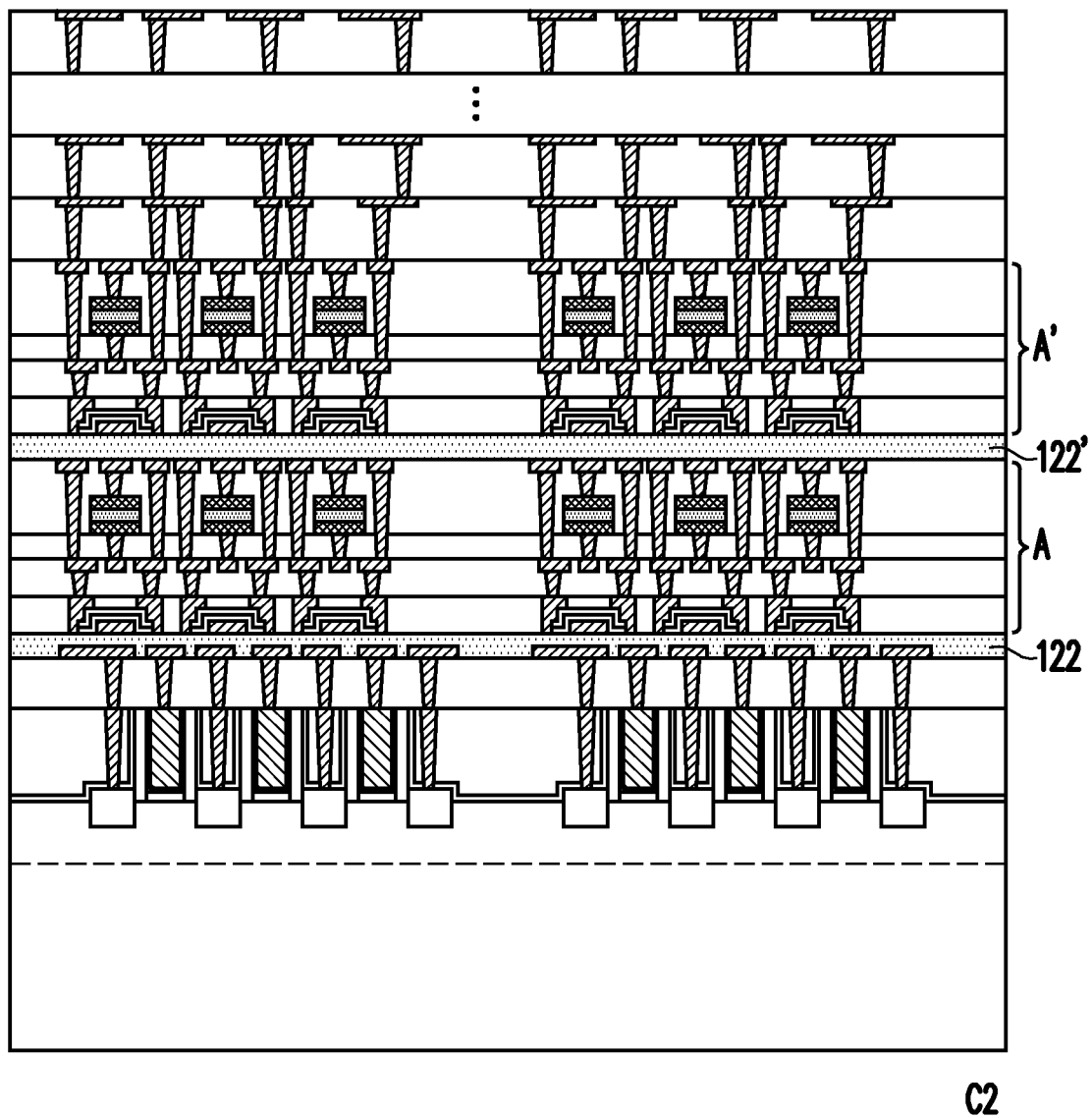

Referring to FIG. 16 and FIG. 18, the semiconductor chip C2 illustrated in FIG. 18 is similar to the semiconductor chip C illustrated in FIG. 16 except that the semiconductor chip C2 further includes a buffer layer 122' and a memory cell array A', the buffer layer 122' is disposed over the memory cell array A, and the memory cell array A' is disposed on the buffer layer 122'. In the present embodiment, two or more stacked memory cell arrays may be formed in the semiconductor chip C2. Accordingly, the memory cell arrays A and A' with high density may be easily fabricated in the semiconductor chip C2.

Figure 19:
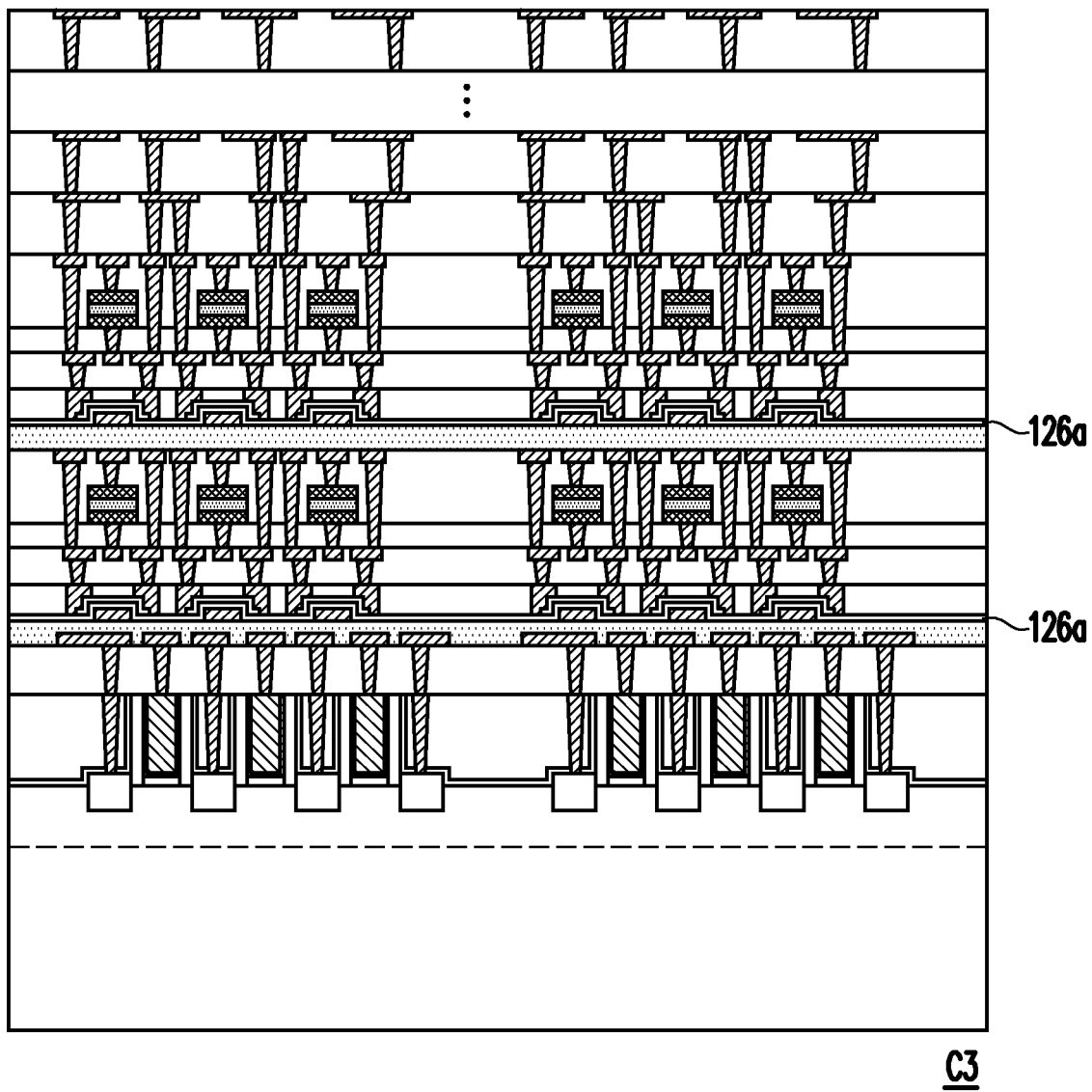

Referring to FIG. 18 and FIG. 19, the semiconductor chip C3 illustrated in FIG. 19 is similar to the semiconductor chip C2 illustrated in FIG. 18 except that the driving transistors TR located at the same level height include thin film transistors sharing a gate insulating layer 126a. The material of the gate insulating layers 126a may be or include silicon dioxide ($SiO_2$), aluminum oxide ($Al_2O_3$), or other applicable insulating materials, or a combination thereof. The gate insulating layers 126a located at different level heights are not patterned.

Figure 20:
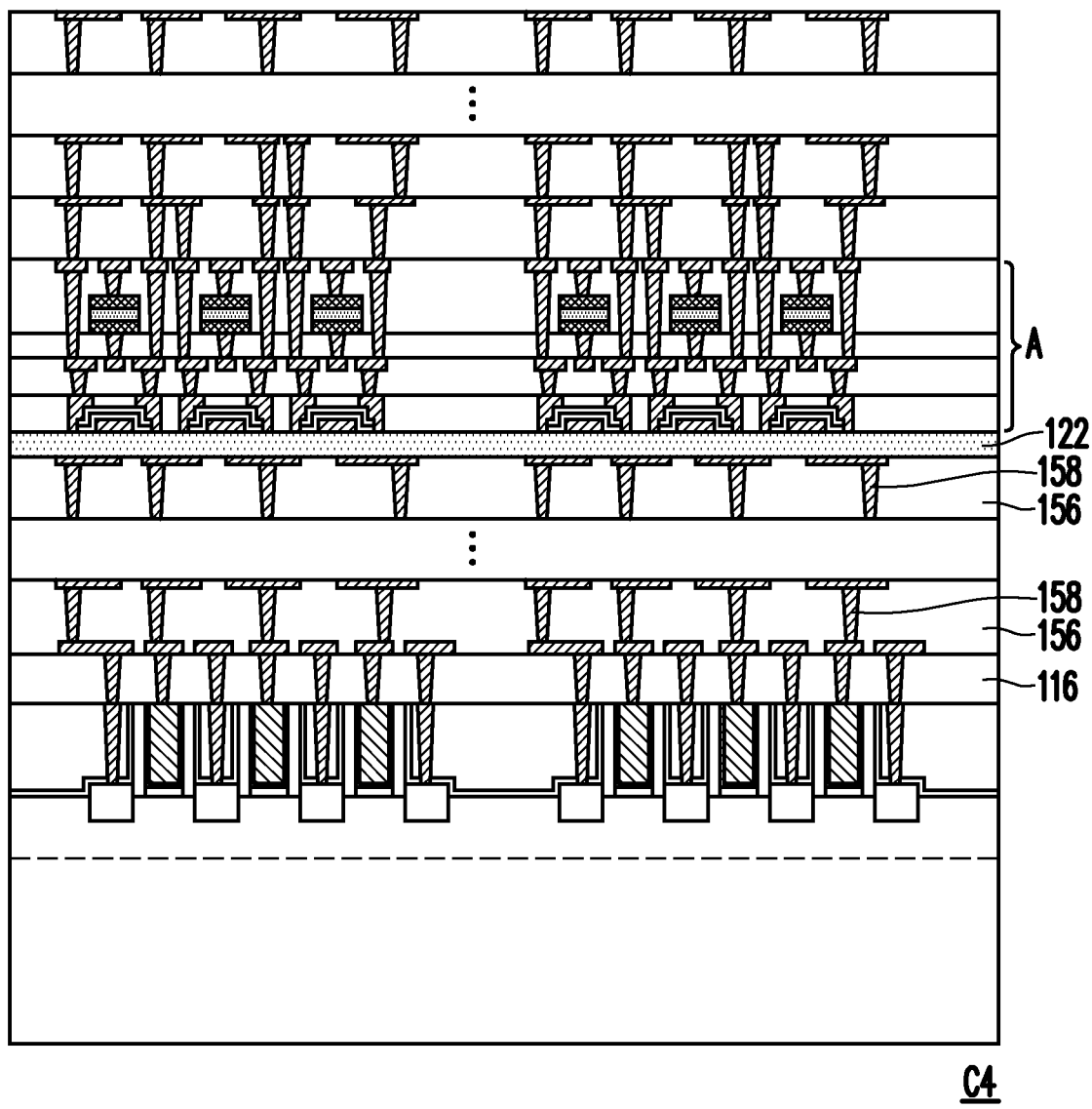

Referring to FIG. 16 and FIG. 20, the semiconductor chip C4 illustrated in FIG. 20 is similar to the semiconductor chip C illustrated in FIG. 16 except that the memory cell array A and the buffer layer 122 of the semiconductor chip C4 are not formed the interlayer dielectric layer 116 directly. Additional interlayer dielectric layers 156 and interconnect wirings 158 are formed between the buffer layer 122 and the interlayer dielectric layer 116. The fabrication of the interlayer dielectric layers 156 and interconnect wirings 158 may be similar to that of the interlayer dielectric layers 152 and interconnect wirings 154. Detailed descriptions relate to the fabrication of the interlayer dielectric layers 156 and interconnect wirings 158 are thus omitted.

Figure 21:
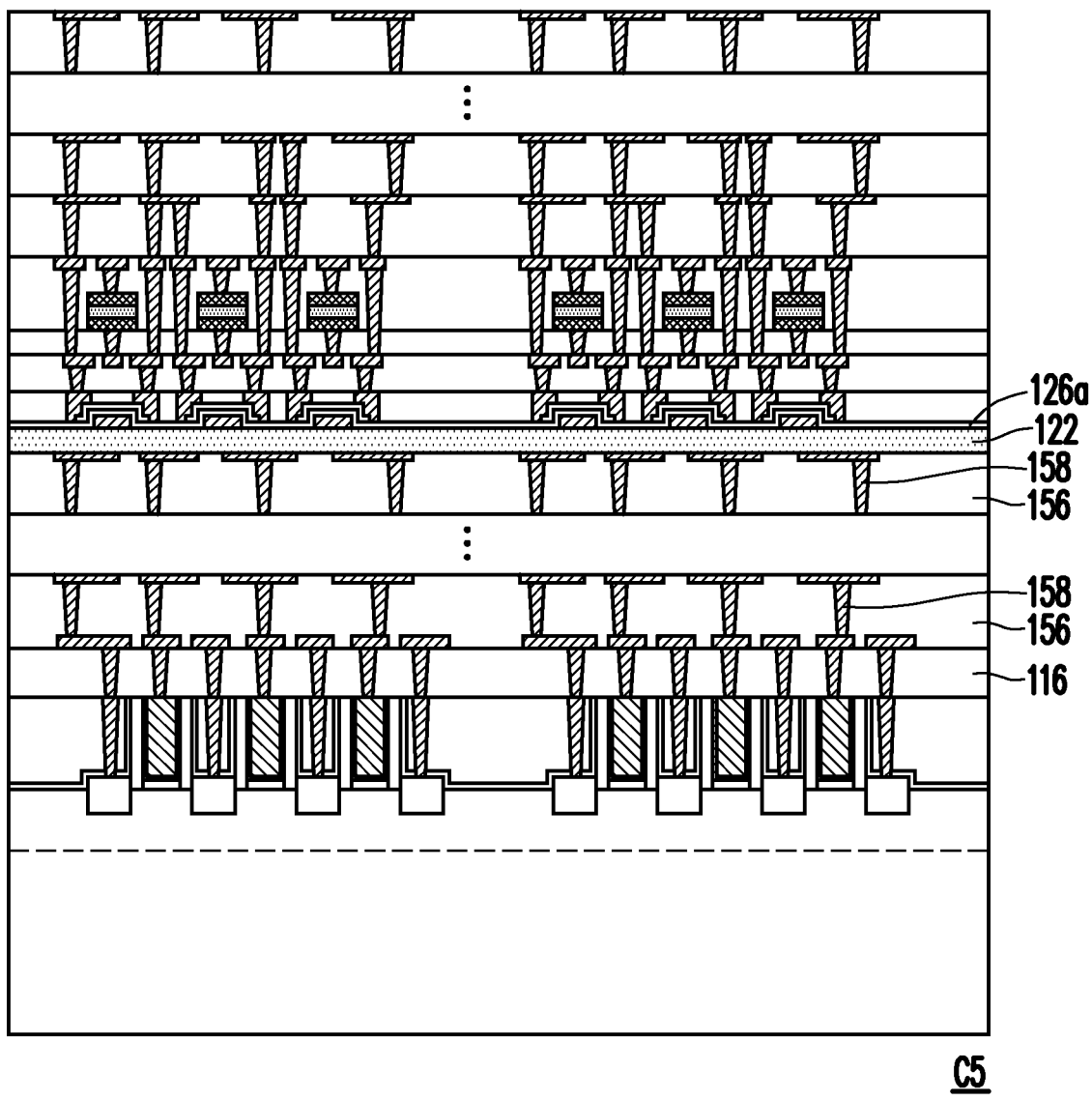

Referring to FIG. 20 and FIG. 21, the semiconductor chip C5 illustrated in FIG. 21 is similar to the semiconductor chip C4 illustrated in FIG. 20 except that the driving transistors TR include thin film transistors sharing a gate insulating layer 126a. The material of the gate insulating layer 126a may be or include silicon dioxide ($SiO_2$), aluminum oxide ($Al_2O_3$), or other applicable insulating materials, or a combination thereof. The gate insulating layer 126a is not patterned such that the gate insulating layer 126a entirely covers the buffer layer 122 and the gates 124 of the driving transistors TR.

Since at least one layer of the memory cell array may be integrated into an interconnect structure of a semiconductor chip formed by manufacturing processes of back end of line (BEOL), layout area of the memory cell array may increase significantly. Further, the adjustment of capacitance of the memory devices (e.g., ferroelectric capacitors) in the memory cell array may be more flexible. Accordingly, it is easy to form the memory cell array having high capacity and/or high density.

In the above-mentioned embodiments, NCFETs are implemented in logic devices, I/O devices, and peripheral devices fabricated by manufacturing process of FEOL, operation current ($I_{on}$) of the NCFETs may be increased, and operation voltage as well as power consumption of the NCFETs may be reduced.

In accordance with some embodiments of the disclosure, a semiconductor chip including a semiconductor substrate, an interconnect structure and memory devices is provided. The semiconductor substrate includes first transistors, and the first transistors are negative capacitance field effect transistors. The interconnect structure is disposed over the semiconductor substrate and electrically connected to the first transistors, and the interconnect structure includes stacked interlayer dielectric layers, interconnect wirings, and second transistors embedded in the stacked interlayer dielectric layers. The memory devices are embedded in the stacked interlayer dielectric layers and electrically connected to the second transistors. In some embodiments, the second transistors are embedded in a first interlayer dielectric layer among the stacked interlayer dielectric layers, the memory devices are embedded in a second interlayer dielectric layer among the stacked interlayer dielectric layers, and the second interlayer dielectric layer covers the first interlayer dielectric layer. In some embodiments, the semiconductor chip further includes a dielectric layer covering the first transistors. In some embodiments, the semiconductor chip further includes a buffer layer covering the dielectric layer, wherein the interconnect structure and the second transistors are disposed on the buffer layer. In some embodiments, the second transistors include thin film transistors disposed on the buffer layer. In some embodiments, each of the memory devices includes a first electrode, a second electrode and a storage layer between the first and second electrodes. In some embodiments, at least one of the negative capacitance field effect transistors includes a gate electrode, a gate dielectric layer, a ferroelectric layer disposed between the gate electrode and the gate dielectric layer, a pair of spacer elements, a source feature, and a drain feature, wherein the gate electrode, the gate dielectric layer, and the ferroelectric layer are disposed between the pair of spacer elements, and the source and drain features are respectively disposed at opposite sides of the gate electrode. In some embodiments, the gate electrode is laterally spaced apart from the pair of spacer elements by first portions of the ferroelectric layer, the gate electrode is spaced apart from the gate dielectric layer by a second portion of the ferroelectric layer, and the first portions of the ferroelectric layer is disposed at opposite sides of the second portion of the ferroelectric layer.

In accordance with some other embodiments of the disclosure, a semiconductor chip including a semiconductor substrate, an interconnect structure and a memory cell array is provided. The semiconductor substrate includes fin-type field effect transistors, at least one of the fin-type field effect transistors includes a fin structure, a gate stack covering a portion of the fin structure, and epitaxial structures disposed at opposite sides of the gate stack, wherein the gate stack includes a ferroelectric layer integrated therein. The interconnect structure is disposed on the semiconductor substrate and electrically connected to the fin-type field effect transistors, and the interconnect structure includes stacked interlayer dielectric layers and interconnect wirings embedded in the stacked interlayer dielectric layers. The memory cell array is embedded in the stacked interlayer dielectric layers. The memory cell array includes driving transistors and memory devices, and the memory devices are electrically connected the driving transistors through the interconnect wirings. In some embodiments, the memory cell array includes word lines, bit lines, the driving transistors and the memory devices, the memory devices are electrically connected the word lines, and sources of the driving transistors are electrically connected to the bit lines. In some embodiments, the driving transistors are embedded in a first interlayer dielectric layer among the stacked interlayer dielectric layers, and the memory devices of the memory cell array are embedded in a second interlayer dielectric layer among the stacked interlayer dielectric layers. In some embodiments, the semiconductor chip further includes a dielectric layer covering the fin-type field effect transistors and a buffer layer covering the dielectric layer, wherein the interconnect structure and the memory cell array are disposed on the buffer layer. In some embodiments, the driving transistors include thin film transistors disposed on the buffer layer. In some embodiments, the driving transistors include thin film transistors sharing a gate insulating layer. In some embodiments, the gate stack of the at least one of the fin-type field effect transistors includes a gate electrode and a gate dielectric layer covering the portion of the fin structure, wherein the gate electrode is spaced apart from the gate dielectric layer by the ferroelectric layer.

In accordance with some other embodiments of the disclosure, a semiconductor chip including a semiconductor, an interconnect structure and a memory cell array is provided. The semiconductor substrate includes negative capacitance field effect transistors, wherein at least one of the negative capacitance field effect transistors includes a source feature, a drain feature, a gate electrode, a gate dielectric layer and a ferroelectric layer disposed between the gate electrode and the gate dielectric layer. The interconnect structure is disposed on the semiconductor substrate and electrically connected to the negative capacitance field effect transistors, and the interconnect structure includes stacked interlayer dielectric layers and interconnect wirings embedded in the stacked interlayer dielectric layers. The memory cell array includes a driving circuit and memory devices. The driving circuit includes thin film transistors embedded in the stacked interlayer dielectric layers. The memory devices are embedded in the stacked interlayer dielectric layers and electrically connected to the thin film transistors through the interconnect wirings. In some embodiments, the driving circuit includes word lines, bit lines, and the thin film transistors having oxide semiconductor channel layers, wherein the memory devices are electrically connected the word lines, and sources of the thin film transistors are electrically connected to the bit lines. In some embodiments, a thickness of the ferroelectric layer is substantially equal to or less than a thickness of the gate dielectric layer. In some embodiments, a thickness ratio of the ferroelectric layers and the gate dielectric layer ranges from about 0.1 to about 1.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor chip, comprising:
   a semiconductor substrate comprising first transistors, and the first transistors being negative capacitance field effect transistors;
   a buffer layer disposed over the semiconductor substrate, wherein the buffer layer is a single layer;

conductive wirings embedded in the buffer layer and electrically connected to the first transistors;
an interconnect structure disposed on the buffer layer and electrically connected to the first transistors, the interconnect structure comprising stacked interlayer dielectric layers, interconnect wirings, and second transistors embedded in the stacked interlayer dielectric layers, at least one of the second transistors comprising:
a gate in direct contact with the buffer layer,
a gate insulating pattern covering the gate;
a semiconductor channel layer disposed on the gate insulating pattern to cover the gate;
a source feature and a drain feature cover portions of the semiconductor channel layer, wherein the gate is spaced apart from the source feature and the drain feature by the semiconductor channel layer, and the source feature and the drain feature cover a sidewall of the gate insulating pattern and a sidewall of the semiconductor channel layer;
memory devices embedded in the stacked interlayer dielectric layers and electrically connected to the second transistors, wherein the memory devices each comprises a magnetic layer or a ferroelectric storage layer.

2. The semiconductor chip as claimed in claim 1, wherein the second transistors are embedded in a first interlayer dielectric layer among the stacked interlayer dielectric layers, the memory devices are embedded in a second interlayer dielectric layer among the stacked interlayer dielectric layers, and the second interlayer dielectric layer covers the first interlayer dielectric layer.

3. The semiconductor chip as claimed in claim 2, further comprising a dielectric layer covering the first transistors.

4. The semiconductor chip as claimed in claim 3, wherein the buffer layer covers the dielectric layer, and the source feature and the drain feature are in contact with the buffer layer.

5. The semiconductor chip as claimed in claim 1, wherein the source feature and the drain feature are disposed at a top side of the semiconductor channel layer, and the gate is disposed at a bottom side of the semiconductor channel layer.

6. The semiconductor chip as claimed in claim 1, wherein each of the memory devices further comprises a first electrode and a second electrode, the magnetic layer or the ferroelectric storage layer is between the first electrode and the second electrode.

7. The semiconductor chip as claimed in claim 1, wherein at least one of the negative capacitance field effect transistors comprises:
a gate electrode;
a gate dielectric layer;
a ferroelectric layer disposed between the gate electrode and the gate dielectric layer;
a pair of spacer elements, wherein the gate electrode, the gate dielectric layer, and the ferroelectric layer are disposed between the pair of spacer elements; and
a source feature and a drain feature respectively disposed at opposite sides of the gate electrode.

8. The semiconductor chip as claimed in claim 7, wherein the gate electrode is laterally spaced apart from the pair of spacer elements by first portions of the ferroelectric layer, the gate electrode is spaced apart from the gate dielectric layer by a second portion of the ferroelectric layer, and the first portions of the ferroelectric layer is disposed at opposite sides of the second portion of the ferroelectric layer.

9. A semiconductor chip, comprising:
a semiconductor substrate comprising fin-type field effect transistors, and at least one of the fin-type field effect transistors comprising:
a fin structure;
a gate stack covering a portion of the fin structure, the gate stack comprising a ferroelectric layer integrated therein;
epitaxial structures disposed at opposite sides of the gate stack;
a buffer layer disposed over the semiconductor substrate;
conductive wirings embedded in the buffer layer;
an interconnect structure disposed on the buffer layer and electrically connected to the fin-type field effect transistors, the interconnect structure comprising stacked interlayer dielectric layers and interconnect wirings embedded in the stacked interlayer dielectric layers; and
a memory cell array embedded in the stacked interlayer dielectric layers, the memory cell array comprising driving transistors in direct contact with the buffer layer and embedded in a first interlayer dielectric layer among the stacked interlayer dielectric layers and memory devices, the memory devices comprising magnetic tunneling junction (MTJ) memory devices or ferroelectric capacitors, the memory devices being electrically connected the driving transistors through the interconnect wirings, and at least one of the driving transistors comprising:
a gate;
a gate insulating pattern and a semiconductor channel layer covering the gate;
a source feature and a drain feature electrically connected to portions of the semiconductor channel layer, wherein the source feature and the drain feature are disposed at a first side of the semiconductor channel layer, the gate is disposed at a second side of the semiconductor channel layer, and the first side is opposite to the second side, and the source feature and the drain feature cover a sidewall of the gate insulating pattern and a sidewall of the semiconductor channel layer, and wherein an interface is between the buffer layer and the first interlayer dielectric layer, and bottom surfaces of the source feature and the drain feature are substantially level with the interface.

10. The semiconductor chip as claimed in claim 9, wherein the MTJ memory devices each comprises a magnetic stacking, and the magnetic stacking comprises an insulating tunnel barrier and magnetic layers separated by the insulating tunnel barrier.

11. The semiconductor chip as claimed in claim 10, wherein the memory devices of the memory cell array are embedded in a second interlayer dielectric layer among the stacked interlayer dielectric layers, the second interlayer dielectric layer covers the first interlayer dielectric layer, and top surfaces of the source feature and the drain feature are substantially level with a top surface of the first interlayer dielectric layer.

12. The semiconductor chip as claimed in claim 11, further comprising:
a dielectric layer covering the fin-type field effect transistors, wherein
the buffer layer covers the dielectric layer.

13. The semiconductor chip as claimed in claim 11, wherein the ferroelectric capacitors each comprises a first electrode, a second electrode and a ferroelectric storage layer disposed between the first electrode and the second electrode.

14. The semiconductor chip as claimed in claim 9, wherein the driving transistors comprise thin film transistors having respective gate insulating patterns.

15. The semiconductor chip as claimed in claim 9, wherein the gate stack of the at least one of the fin-type field effect transistors comprises:

a gate electrode; and a gate dielectric layer covering the portion of the fin structure, wherein the gate electrode is spaced apart from the gate dielectric layer by the ferroelectric layer.

16. The semiconductor chip as claimed in claim 9, wherein the gate insulating pattern is in contact with a sidewall of the gate.

17. A semiconductor chip, comprising:

a semiconductor substrate comprising negative capacitance field effect transistors, at least one of the negative capacitance field effect transistors comprising a source feature, a drain feature, a gate electrode, a gate dielectric layer and a ferroelectric layer disposed between the gate electrode and the gate dielectric layer;

an interconnect structure disposed on the semiconductor substrate and electrically connected to the negative capacitance field effect transistors, the interconnect structure comprising stacked interlayer dielectric layers and interconnect wirings embedded in the stacked interlayer dielectric layers;

a memory cell array, comprising:

a driving circuit comprising thin film transistors embedded in a first interlayer dielectric layer among the stacked interlayer dielectric layers, and at least one of the thin film transistors comprising:

a gate;

a gate insulating pattern covering the gate;

a semiconductor channel layer disposed on the gate insulating pattern to cover the gate;

a source feature and a drain feature electrically connected to the semiconductor channel layer, wherein the source feature and the gate are disposed at opposite sides of the semiconductor channel layer, and the source feature and the drain feature cover a sidewall of the gate insulating pattern and a sidewall of the semiconductor channel layer, and a full thickness of each of the source feature and the drain feature is substantially equal to a full thickness of the first interlayer dielectric layer; and memory devices embedded in a second interlayer dielectric layer among the stacked interlayer dielectric layers and electrically connected to the thin film transistors through the interconnect wirings, wherein the memory devices comprise magnetic tunneling junction (MTJ) memory devices or ferroelectric capacitors.

18. The semiconductor chip as claimed in claim 17, wherein the MTJ memory devices each comprises a magnetic stacking, and the magnetic stacking comprise an insulating tunnel barrier, a free layer and a reference layer, the free layer and the reference layer are separated by the insulating tunnel barrier.

19. The semiconductor chip as claimed in claim 17, wherein the ferroelectric capacitors each comprises a first electrode, a second electrode and a ferroelectric storage layer disposed between the first electrode and the second electrode.

20. The semiconductor chip as claimed in claim 19, wherein a thickness ratio of the ferroelectric layer and the gate dielectric layer ranges from 0.1 to 1, and the sidewall of the gate insulating pattern and the sidewall of the semiconductor channel layer are aligned.

* * * * *